United States Patent
Okamura

(10) Patent No.: US 9,548,672 B2
(45) Date of Patent: Jan. 17, 2017

(54) ELECTRIC POWER CONVERTER

(71) Applicant: DENSO CORPORATION, Kariya, Aichi-pref. (JP)

(72) Inventor: Makoto Okamura, Nisshin (JP)

(73) Assignee: DENSO CORPORATION, Kariya (JP)

( * ) Notice: Subject to any disclaimer, the term of this patent is extended or adjusted under 35 U.S.C. 154(b) by 148 days.

(21) Appl. No.: 14/096,681

(22) Filed: Dec. 4, 2013

(65) Prior Publication Data

US 2014/0153189 A1 Jun. 5, 2014

(30) Foreign Application Priority Data

Dec. 4, 2012 (JP) ................. 2012-265587

(51) Int. Cl.
| | | |
|---|---|---|
| H05K 1/02 | (2006.01) | |
| H05K 7/14 | (2006.01) | |
| H05K 7/20 | (2006.01) | |
| H02M 7/00 | (2006.01) | |

(52) U.S. Cl.
CPC ........... *H02M 7/003* (2013.01); *H05K 1/0213* (2013.01); *H05K 7/1432* (2013.01); *H05K 7/20927* (2013.01)

(58) Field of Classification Search
CPC .... H02M 7/003; H05K 1/0213; H05K 5/0091; H05K 7/1432
USPC ......................................................... 361/688
See application file for complete search history.

(56) References Cited

U.S. PATENT DOCUMENTS

| | | | | |
|---|---|---|---|---|
| 4,983,128 A | * | 1/1991 | Dale et al. ..................... | 439/214 |
| 8,514,590 B2 | * | 8/2013 | Nakasaka et al. ............ | 361/831 |
| 8,879,256 B2 | * | 11/2014 | Ichijyo et al. ................ | 361/699 |
| 8,929,097 B2 | * | 1/2015 | Nakasaka et al. ............ | 361/831 |
| 8,963,322 B2 | * | 2/2015 | Kiuchi et al. ................. | 257/712 |
| 9,029,977 B2 | * | 5/2015 | Inamura ........................ | 257/499 |
| 2002/0004328 A1 | * | 1/2002 | Chevassus-More et al. . | 439/212 |
| 2004/0137792 A1 | * | 7/2004 | Matsumura et al. ......... | 439/630 |
| 2004/0141292 A1 | * | 7/2004 | Onizuka et al. .............. | 361/704 |
| 2006/0096299 A1 | * | 5/2006 | Mamitsu et al. ................ | 62/3.2 |
| 2006/0226450 A1 | * | 10/2006 | Furuta et al. ................. | 257/208 |
| 2006/0284308 A1 | * | 12/2006 | Harada et al. ................ | 257/729 |
| 2009/0109606 A1 | * | 4/2009 | Brutsch ........................ | 361/648 |

(Continued)

FOREIGN PATENT DOCUMENTS

| | | |
|---|---|---|
| JP | 04-321265 | 11/1992 |
| JP | 2006-295997 | 10/2006 |

(Continued)

*Primary Examiner* — Zachary M Pape
*Assistant Examiner* — Amir Jalali
(74) *Attorney, Agent, or Firm* — Nixon & Vanderhye PC

(57) ABSTRACT

An electric power converter has a stacked body formed by stacking a plurality of semiconductor modules and coolers, a capacitor, and positive and negative bus bars. Each of the bus bars is formed by two sheets of plate members, respectively. Each of the plate members has a body portion, a plurality of extended portions, and a plurality of terminal connecting portions. The terminal connecting portions are connected to power terminals of the semiconductor modules. The main body portion of each plate member are joined to each other so that the terminal connecting portion of the one of the plate members and the terminal connecting portion 44 of the other one of the plate member are disposed alternately in a stacking direction of the stacked body.

2 Claims, 17 Drawing Sheets

(56) References Cited

U.S. PATENT DOCUMENTS

| | | | |
|---|---|---|---|
| 2009/0225577 A1* | 9/2009 | Onishi et al. | 363/131 |
| 2009/0257211 A1* | 10/2009 | Kontani et al. | 361/782 |
| 2010/0327949 A1* | 12/2010 | Gotou | 327/487 |
| 2011/0127061 A1* | 6/2011 | Gotou | 174/68.2 |
| 2011/0194246 A1* | 8/2011 | Nakasaka et al. | 361/688 |
| 2011/0194247 A1* | 8/2011 | Nakasaka et al. | 361/689 |
| 2011/0261600 A1* | 10/2011 | Tachibana | 363/131 |
| 2011/0280056 A1* | 11/2011 | Noda | 363/146 |
| 2012/0001341 A1* | 1/2012 | Ide et al. | 257/773 |
| 2012/0006595 A1* | 1/2012 | Tachibana | 174/74 R |
| 2012/0008282 A1* | 1/2012 | Ide et al. | 361/702 |
| 2012/0015550 A1* | 1/2012 | Ikeda et al. | 439/391 |
| 2012/0300521 A1* | 11/2012 | Hida et al. | 363/131 |
| 2012/0306474 A1* | 12/2012 | Ikeda et al. | 324/72 |
| 2013/0000957 A1* | 1/2013 | Ikeda et al. | 174/254 |
| 2013/0028001 A1* | 1/2013 | Yokota | 363/144 |
| 2013/0058068 A1* | 3/2013 | Funatsu | 361/820 |
| 2013/0058143 A1* | 3/2013 | Tachibana | 363/131 |
| 2013/0070502 A1* | 3/2013 | Suzuki et al. | 363/131 |
| 2013/0121052 A1* | 5/2013 | Yamaura | 363/131 |
| 2013/0241082 A1* | 9/2013 | Okamura | 257/777 |
| 2013/0264891 A1* | 10/2013 | Sawada et al. | 307/147 |
| 2013/0272046 A1* | 10/2013 | Matsuoka et al. | 363/132 |
| 2014/0092663 A1* | 4/2014 | Shimizu et al. | 363/141 |
| 2014/0098496 A1* | 4/2014 | Nakasaka | 361/699 |
| 2014/0118909 A1* | 5/2014 | Matsuno et al. | 361/679.01 |
| 2014/0119087 A1* | 5/2014 | Matsuoka et al. | 363/132 |
| 2014/0140034 A1* | 5/2014 | Kusada et al. | 361/820 |
| 2014/0185266 A1* | 7/2014 | Iwata et al. | 361/820 |
| 2015/0123261 A1* | 5/2015 | Hironaka et al. | 257/719 |

FOREIGN PATENT DOCUMENTS

| | | |
|---|---|---|
| JP | 2011-109767 | 6/2011 |
| JP | 2011-172469 | 9/2011 |

* cited by examiner

ELECTRIC POWER CONVERTER

CROSS-REFERENCE TO RELATED APPLICATION

This application is based on and claims the benefit of priority from earlier Japanese Patent Application No. 2012-265587 filed Dec. 4, 2012, the description of which is incorporated herein by reference.

TECHNICAL FIELD

The present disclosure relates to an electric power converter that has a semiconductor module with a built-in semiconductor element, a smoothing capacitor, and a bus bar that electrically connects therebetween.

BACKGROUND

An electric power converter that converts power between AC power and DC power is known. Such an electric power converter has a stacked body obtained by stacking a semiconductor module with a built-in semiconductor element and a cooler for cooling the semiconductor module (refer to Japanese Patent Application Laid-Open Publication No. 2011-109767, for example).

The semiconductor module has a positive terminal and a negative terminal in which a DC voltage of the DC power source is applied, and an AC terminal connected to the AC load.

Further, the electric power converter has a capacitor for smoothing the DC voltage.

A plurality of the positive terminals is disposed in a line in a stacking direction of the stacked body.

The plurality of the positive terminals and a positive electrode of the capacitor are electrically connected by a positive bus bar.

Similarly, the plurality of the negative terminals is also disposed in a line in the stacking direction.

Then, the plurality of the negative terminals and a negative electrode of the capacitor are electrically connected by a negative bus bar.

The positive bus bar has a plate-like main body portion, a plurality of extended portions parallel to each other extending laterally from the main body portion, and terminal connecting portions extending from the extended portions in a plate-thickness direction of the body portion.

The terminal connecting portions are joined to the positive terminals and are connected to each other.

The negative bus bar also has a similar structure as the positive bus bar has.

The positive bus bar and the negative bus bar are formed by processing single metal plates, respectively.

That is, when manufacturing these bus bars, first, a flat-plate member is formed by pressing (or the like) a single sheet of metal. This flat-plate member has portions that become terminal connecting portions, extended portions, and a main body portion. Between the portions to be the terminal connecting portions and the extended portions of the flat-plate member are not yet bent (not-bent member).

Thereafter, each of the portions to be the terminal connecting portions is bent at a right angle along a bending line positioned between the portion to be the terminal connecting portions and the extended portion, and parallel to an extending direction of the extended portion.

However, in a conventional electric power converter, there is a problem that the length of the extended portion in the stacking direction is likely to be shortened when the pitch of the stacked body is narrowed.

That is, as described above, when manufacturing the bus bar, the not-bent member is formed with the single sheet of metal first.

The portion to be the terminal connecting portion and the extended portion are adjoining in the stacking direction via a slit in the not-bent member.

The portion to be the terminal connecting portion is connected to the positive terminal or the like after bending.

Therefore, in order to ensure a sufficient contacting surface area, it is necessary to ensure the length of this portion in the stacking direction to a certain amount.

Thus, when narrowing the pitch, it is forced to shorten the length of the extended portions in the stacking direction.

As a result, the extended portion becomes elongated, and a parasitic inductance is likely to be increased.

Therefore, a large voltage surge is likely to occur when the semiconductor element is turned on and off.

SUMMARY

An embodiment provides an electric power converter that can extend a length of an extended portion in a stacking direction, and can suppress an increase of a parasitic inductance in the extended portion.

In an electric power converter according to a first aspect, the electric power converter includes a stacked body formed by stacking a plurality of semiconductor modules having power terminals projecting from a sealed portion where a semiconductor element is sealed and coolers that cool the semiconductor modules, a capacitor for smoothing a DC voltage, and a bus bar that electrically connects the power terminals and the capacitor.

The bus bar is made of a plurality of plate members that are electrically connected to each other, each of the plate members is provided with a body portion disposed so that a main surface thereof is perpendicular with respect to a projecting direction of the power terminal, a plurality of extended portions extending from the main body portion in an extending direction perpendicular to both a stacking direction of the stacked body and the projecting direction, and terminal connecting portions erected in the projecting direction from each of the extended portions A main surface of the terminal connecting portion is perpendicular with respect to the stacking direction.

The terminal connecting portions are joined to the power terminals and are connected to each other.

The main body portion of each plate member are joined to each other to form the bus bar so that the terminal connecting portions formed in the same plate member do not adjoin to each other in the stacking direction.

The bus bar is formed by combining the plurality of plate members while the extended portions extend toward the same direction.

According to the electric power converter mentioned above, the plurality of sheets of the plate members is used to form the single bus bar.

Each of the plate members has the body portion, the extended portions, and the terminal connecting portions.

Then, the main body portion of each plate member are joined to each other to form the single bus bar so that the terminal connecting portions formed in the same plate member do not adjoin to each other in the stacking direction.

Thus, even if the pitch between the terminal connecting portions is narrow when the bus bar is formed by joining the plurality of the plate members, it is possible to obtain a wider pitch (an interval in the stacking direction) between the terminal connecting portions for the individual plate member.

Therefore, it becomes possible to increase the length of the extended portion in the stacking direction.

Thereby, it is possible to prevent the extended portions from being elongated, and can suppress an increase of a parasitic inductance in the extended portions.

Accordingly, the present disclosure can provide the electric power converter that can extend the length of the extended portion in the stacking direction, and can suppress an increase of a parasitic inductance in the extended portion.

In the electric power converter according to a second aspect, the power terminals are composed of a positive terminal and a negative terminal where the DC voltage is applied.

The bus bar is composed of a positive bus bar that connects between a positive electrode of the capacitor and the positive terminal, and a negative bus bar that connects between a negative electrode of the capacitor and the negative terminal.

The positive bus bar and the negative bus bar are constituted of two plate members that include a proximal plate member disposed at a position close to the sealed portion in the projecting direction and a distal plate member disposed at a position farther from the sealed portion than the proximal plate member.

A set of terminal pair is formed by the positive terminal and the negative terminal disposed adjacent to each other in the extending direction. The terminal pairs take either a first connection state A or a second connection state B.

The positive terminal is connected to the proximal plate member of the positive bus bar and the negative terminal is connected to the distal plate member of the negative bus bar in the first connection state A.

The positive terminal is connected to the distal plate member of the positive bus bar and the negative terminal is connected to the proximal plate member of the negative bus bar in the second connection state B.

The terminal pair that takes the first connection state A and the terminal pair that takes the second connection state B are disposed alternately in the stacking direction.

In the electric power converter according to a third aspect, the capacitor has a plurality of capacitor elements that are connected in parallel to each other, and each of the plate members that constitutes the bus bar is connected to the respective capacitor elements.

DETAILED DESCRIPTION OF THE PREFERRED EMBODIMENTS

[First Embodiment]

With reference to FIGS. 1 to 17, hereinafter will be described a first embodiment of the present disclosure regarding an electric power converter.

An electric power converter 1 of the present embodiment is designed for a vehicle use, and is mounted on a hybrid vehicle, an electric vehicle or the like.

Figure 1:
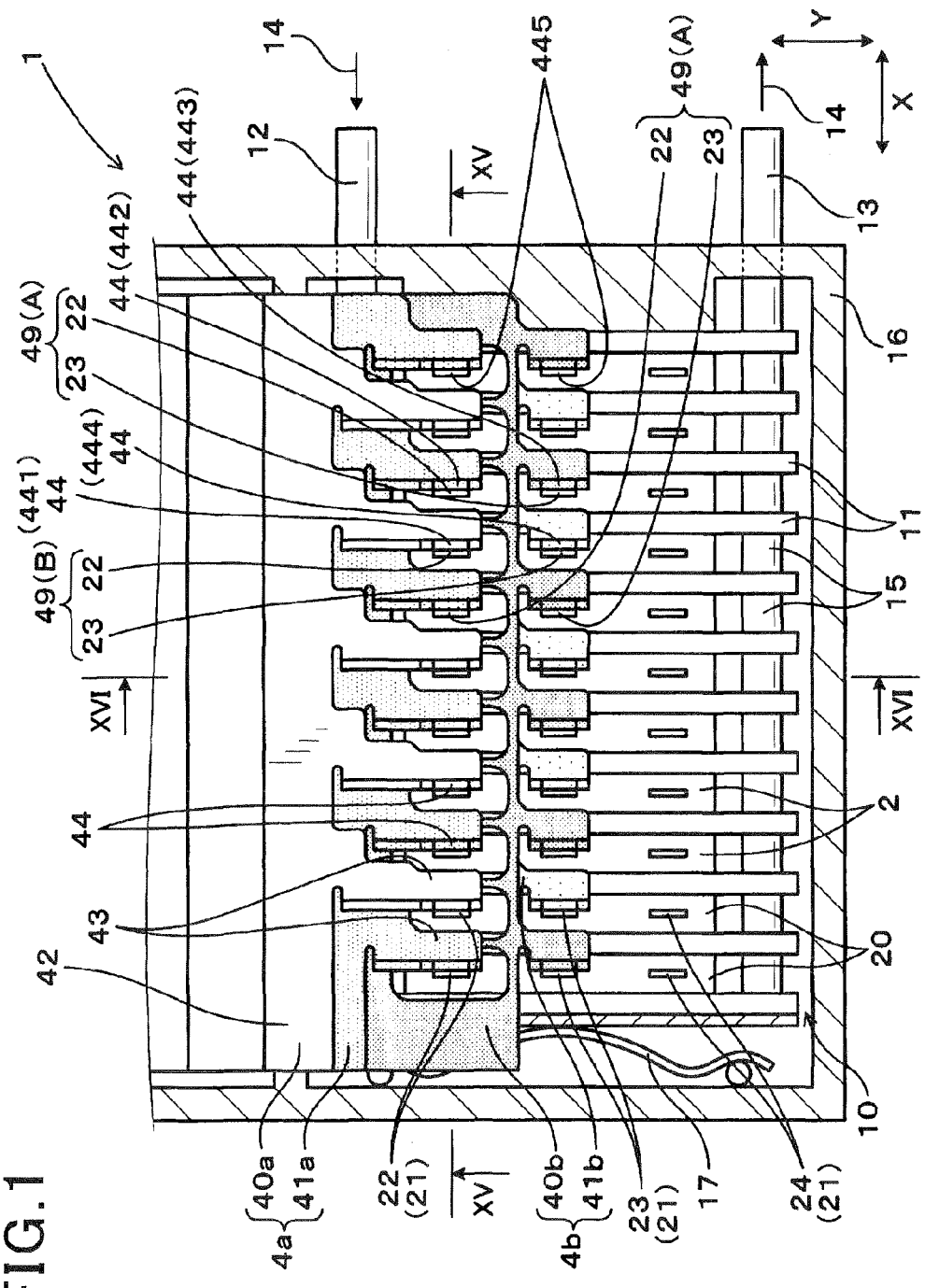
FIG. 1 shows a plan view of an electric power converter in a first embodiment.
Figure 16:
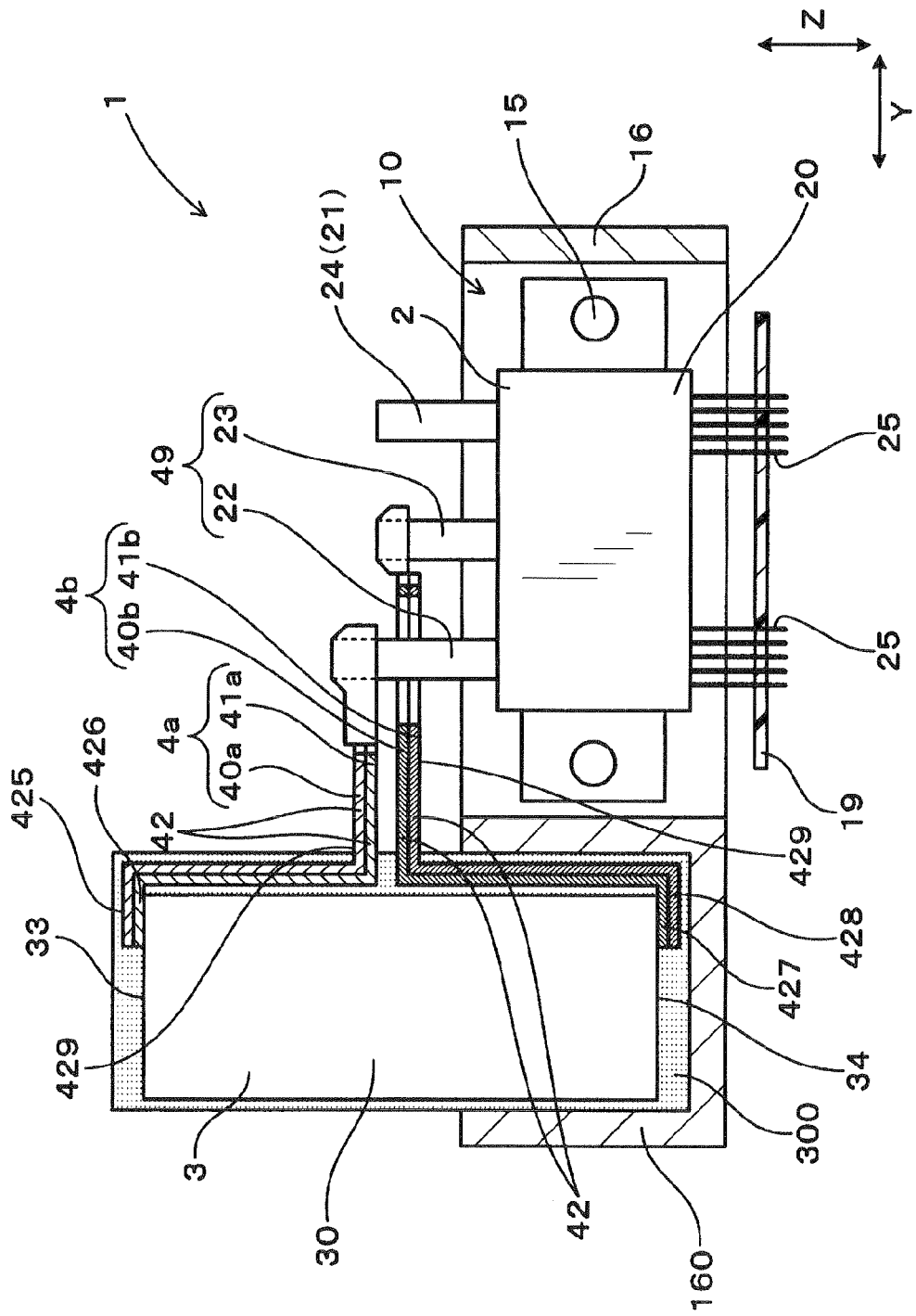
FIG. 16 shows a cross-sectional view taken along a line XVI-XVI of FIG. 1.

As shown in FIG. 1 and FIG. 16, the electric power converter 1 has a stacked body 10, a capacitors 3, and bus bars 4. The stacked body 10 is formed by stacking a plurality of semiconductor modules 2 and coolers 11. The bus bars 4 are composed of a positive bus bar 4a and a negative bus bar 4b.

The capacitor 3 smooths a DC voltage applied to the semiconductor modules 2.

The bus bars 4 electrically connect power terminals 21 and the capacitor 3.

The bus bars 4 are made of two sheets of plate members 40, 41 (40a, 41a, 40b, 41b) that are electrically connected to each other.

Figure 7:
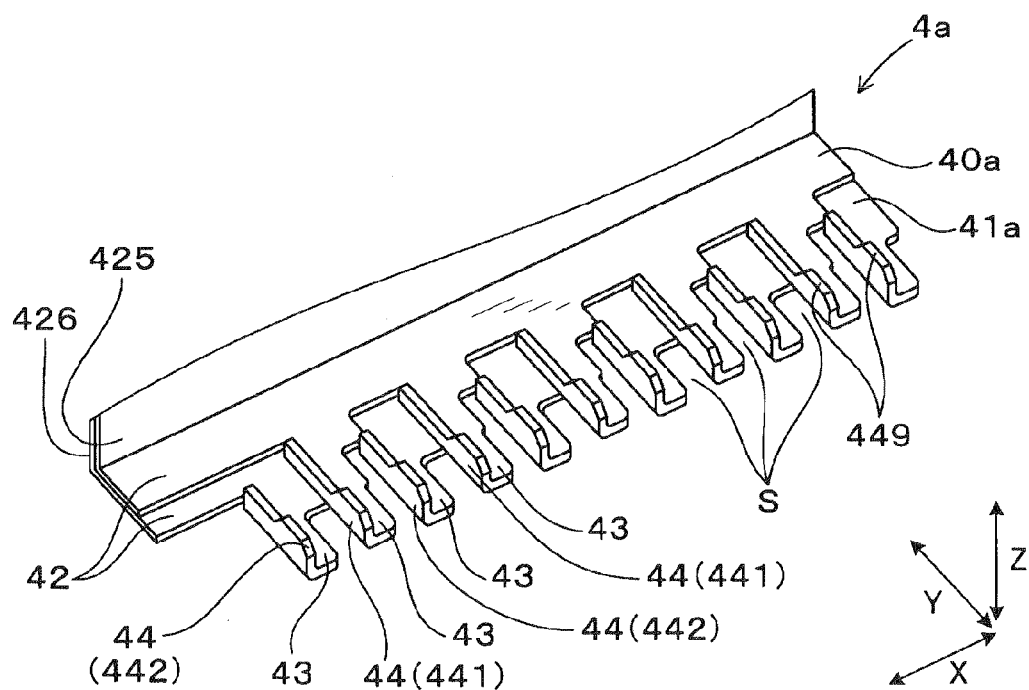
FIG. 7 shows a perspective view of the positive bus bar shown in FIG. 6.
Figure 13:
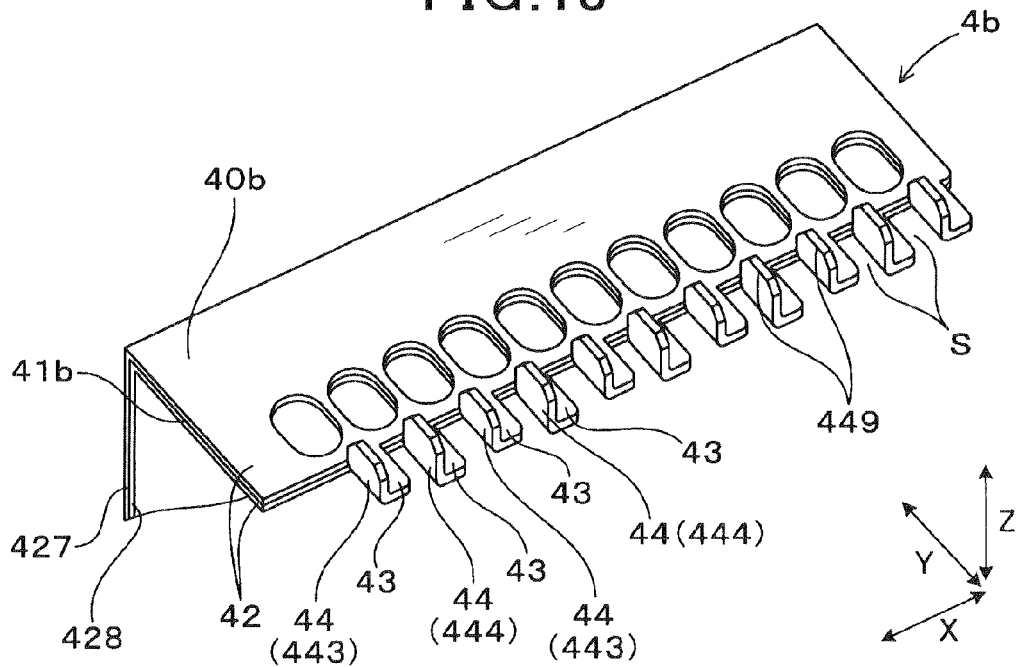
FIG. 13 shows a perspective view of the positive bus bar shown in FIG. 12.

As shown in FIGS. 7 and 13, each of the plate members 40a, 41a, 40b, 41b has a body portion 42, a plurality of extended portions 43, and a plurality of terminal connecting portions 44.

As shown in FIG. 16, the body portion 42 is disposed such that a main surface 429 thereof is perpendicular with respect to a projecting direction of the power terminal 21 (hereafter, this direction is defined as a Z direction).

Further, as shown in FIG. 1, the extended portions 43 extend from the main body portion 42 in an extending direction (hereafter, this direction is defined as a Y direction) perpendicular to both a stacking direction of the stacked body 10 (hereafter, this direction is defined as an X direction) and the Z direction.

Each of the terminal connecting portions 44 is erected in the Z direction from each of the extended portions 43.

A main surface of the terminal connecting portion 44 is perpendicular with respect to the X direction.

The terminal connectors 44 are joined to the power terminals 21 and are connected to each other.

Here, the main surface means a surface having a largest area.

Figure 6:
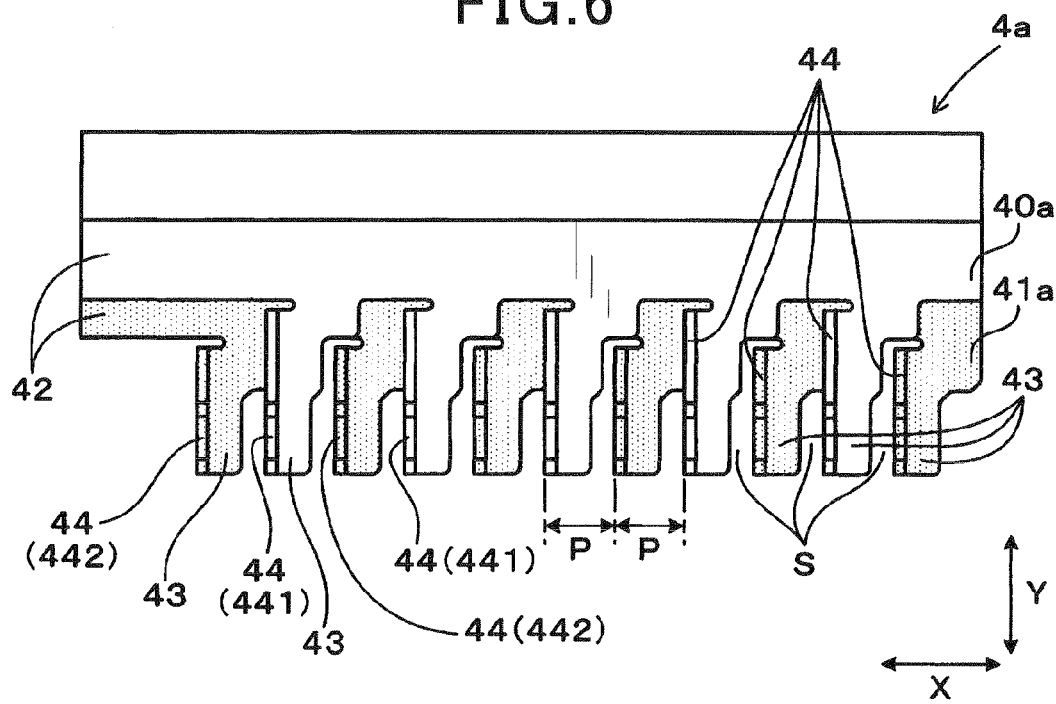
FIG. 6 shows a plan view of the positive bus bar in which two plate members are joined in the first embodiment.

As shown in FIG. 6 and FIG. 7, in the bus bar 4 (positive bus bar 4a), the main body portion 42 of each plate member 40a, 41a are joined to each other so that the terminal connecting portions 44 (441) formed in the same plate member 40a (41a) do not adjoin to each other in the X direction.

Further, the bus bar 4 (positive bus bar 4a) is formed by combining a plurality of plate members 40a, 41a while the extended portions 43 extend toward the same direction (the Y direction).

Figure 12:
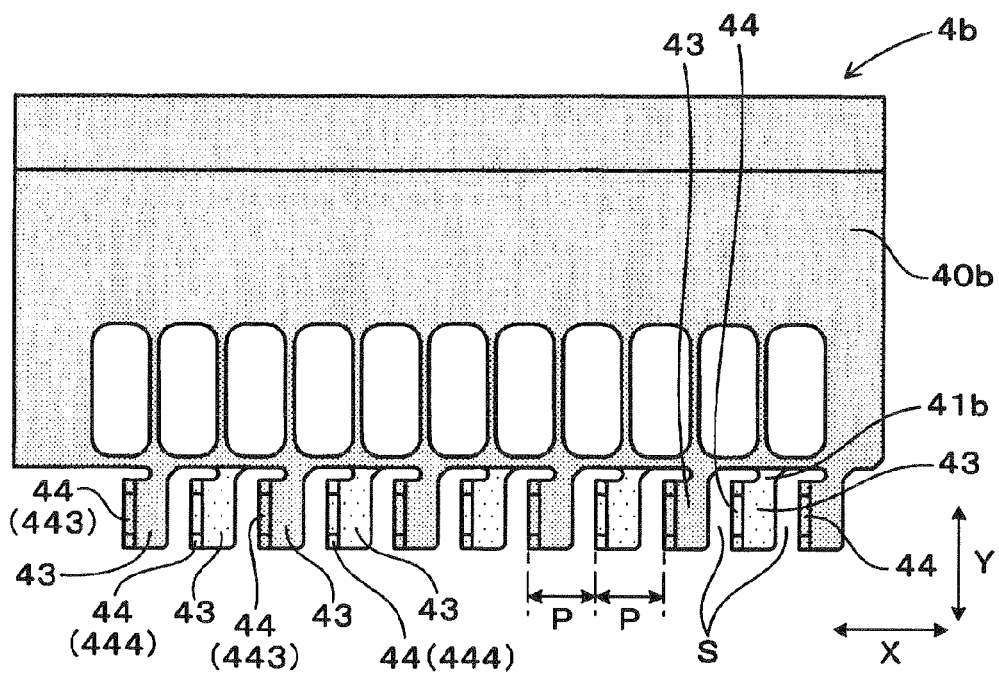
FIG. 12 shows a plan view of the negative bus bar in which two plate members are joined in the first embodiment.

Similarly, as shown in FIGS. 12 and 13, in the negative bus bar 4b, the main body portion 42 of each plate member 40b, 41b are joined to each other so that the terminal connecting portions 44 (443) formed in the same plate member 40b (41b) do not adjoin to each other in the X direction.

Further, the negative bus bar 4b is formed by combining a plurality of plate members 40b, 41b while the extended portions 43 extending toward the same direction (the Y direction).

As shown in FIG. 16, the semiconductor module 2 has a sealed portion 20 where semiconductor elements 29 (refer to FIG. 17) are sealed.

A plurality of power terminals 21 is projecting from the sealed portion 20.

Figure 17:
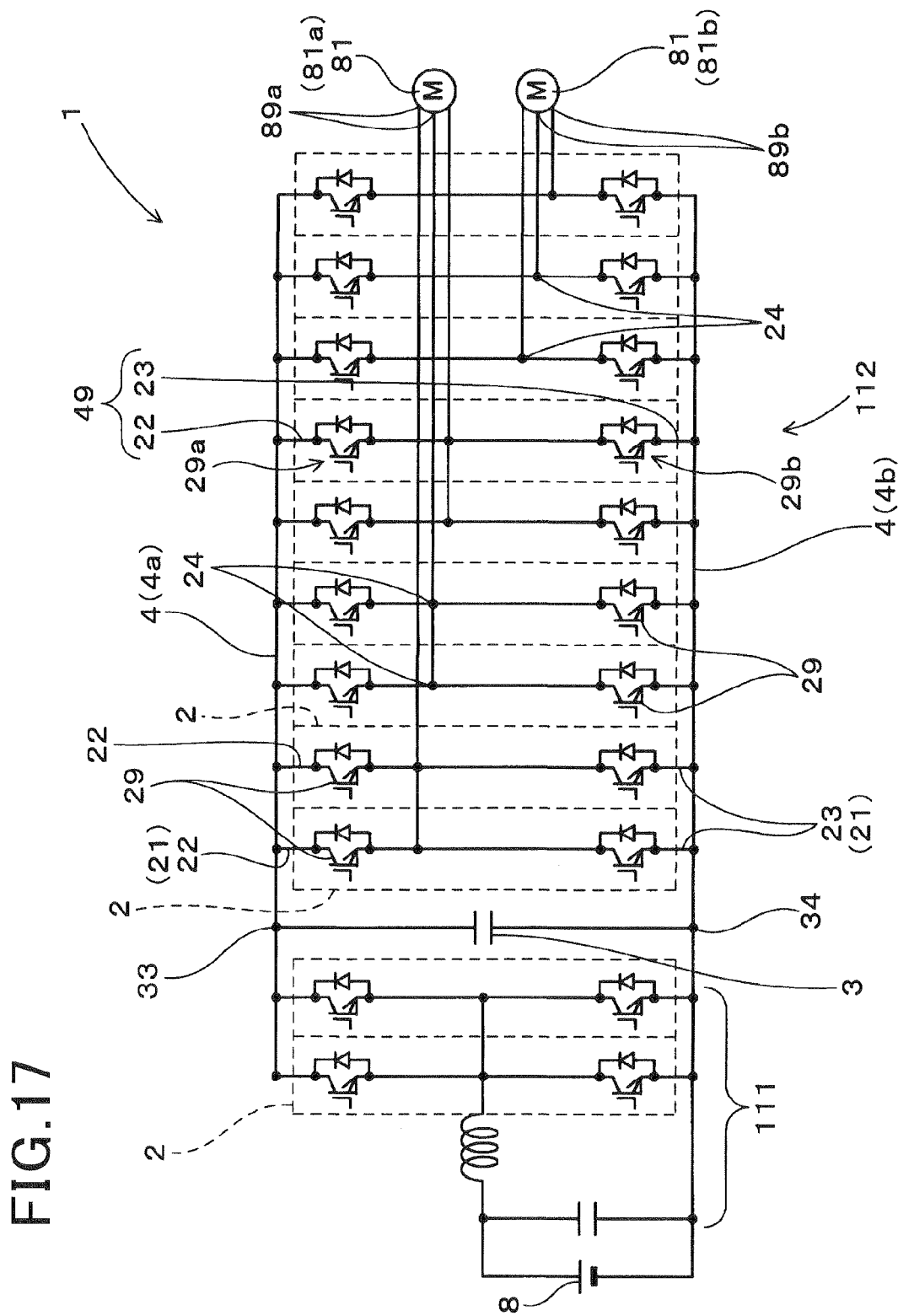
FIG. 17 shows a circuit diagram of the electric power converter in the first embodiment.

The power terminals 21 of the single semiconductor module 2 are composed of a positive terminal 22 and a negative terminal 23 where a DC voltage is applied, and an AC terminal 24 connected to an AC load 81(refer to FIG. 17).

The positive bus bar 4a connects between a positive electrode 33 of the capacitor 3 and the positive terminal 22, and the negative bus bar 4b connects between a negative electrode 34 of the capacitor 3 and the negative terminal 23.

As shown in FIG. 17, a booster circuit 111 and an inverter circuit 112 are formed in the electric power converter 1.

The electric power converter 1 boosts a voltage of a DC power supply 8 by using the booster circuit 111, and the boosted DC voltage is smoothed by the capacitor 3.

Then, by turning on and off the semiconductor elements 29 in the inverter circuit 112, the smoothed DC voltage is converted into an AC voltage which drives the AC load 81.

A pair of the semiconductor element 29 is sealed in the single semiconductor module 2.

The positive terminal 22 of the semiconductor module 2 is connected to the positive electrode 33 of the capacitor 3 by the positive bus bar 4a.

Further, the negative terminal 23 of the semiconductor module 2 is connected to the negative electrode 34 of the capacitor 3 by the negative bus bar 4b.

The electric power converter 1 of the present embodiment is capable of driving two AC loads 81, namely, a first AC load 81a and a second AC load 81b.

As shown in FIG. 17, the AC terminals 24 of the two semiconductor modules 2 are connected in parallel, and are connected to input terminals 89a of the first AC load 81a in the present embodiment.

Further, an input terminal 89b of the second AC load 81b is connected to the AC terminal 24 of the single semiconductor module 2.

As described above, each of the bus bars 4 (the positive bus bar 4a and the negative bus bar 4b) are formed by the two sheets of the plate members 40 and 41, namely, a first plate member 40 and a second plate member 41 (refer to FIGS. 6 and 7).

Figure 3:
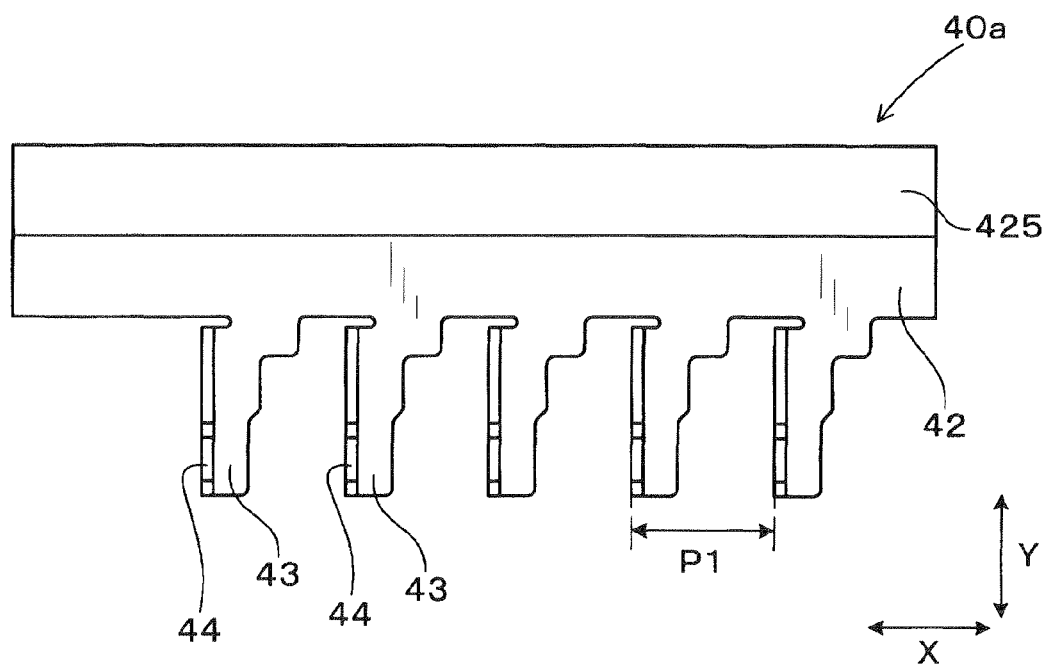
FIG. 3 shows a plan view of the plate member shown in FIG. 2 after bending.

The first plate member 40a has the main body portion 42, the extended portions 43, and the terminal connecting portions 44 as shown in FIG. 3.

Figure 2:
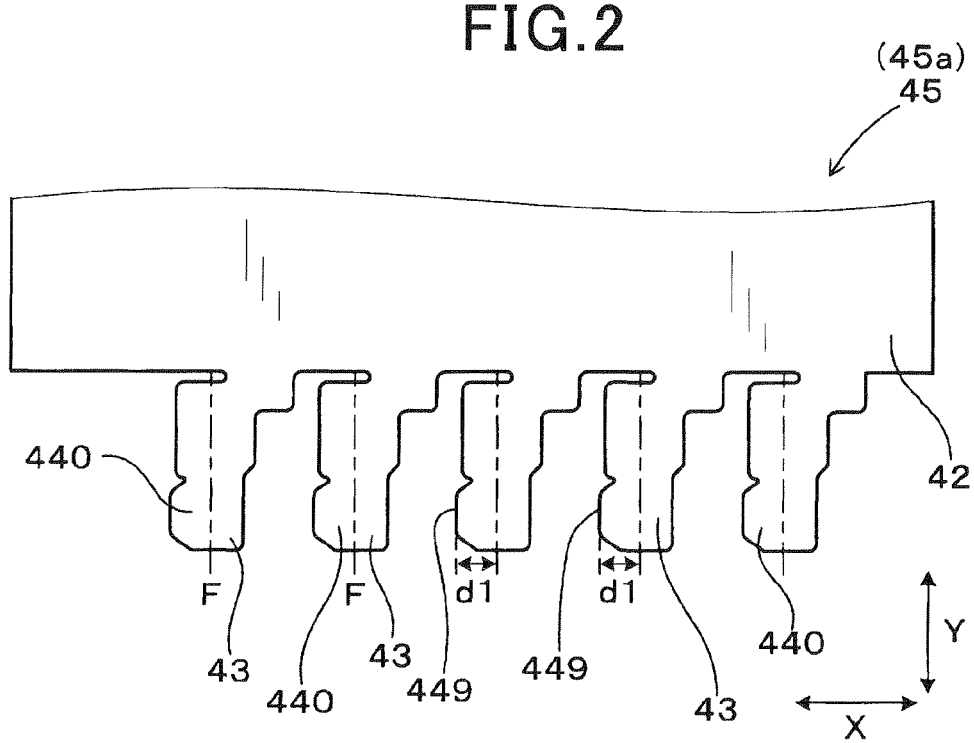
FIG. 2 shows a plan view of one plate member that forms a positive bus bar before bending in the first embodiment.

When manufacturing the first plate member 40a, as shown in FIG. 2, first, a member that between a portion 440 formed to be the terminal connecting portion 44 and the extended portion 43 is not yet bent (not-bent member 45, or a first not-bent member 45a and a second not-bent member 45b) made of a single metal plate is prepared.

Then, the portion 440 is bent along a bending line F positioned between the extended portions 43 and a portion 440 formed to be the terminal connecting portion 44, and parallel to the Y direction.

The portion 440 that has been bent becomes the terminal connecting portion 44.

Figure 4:
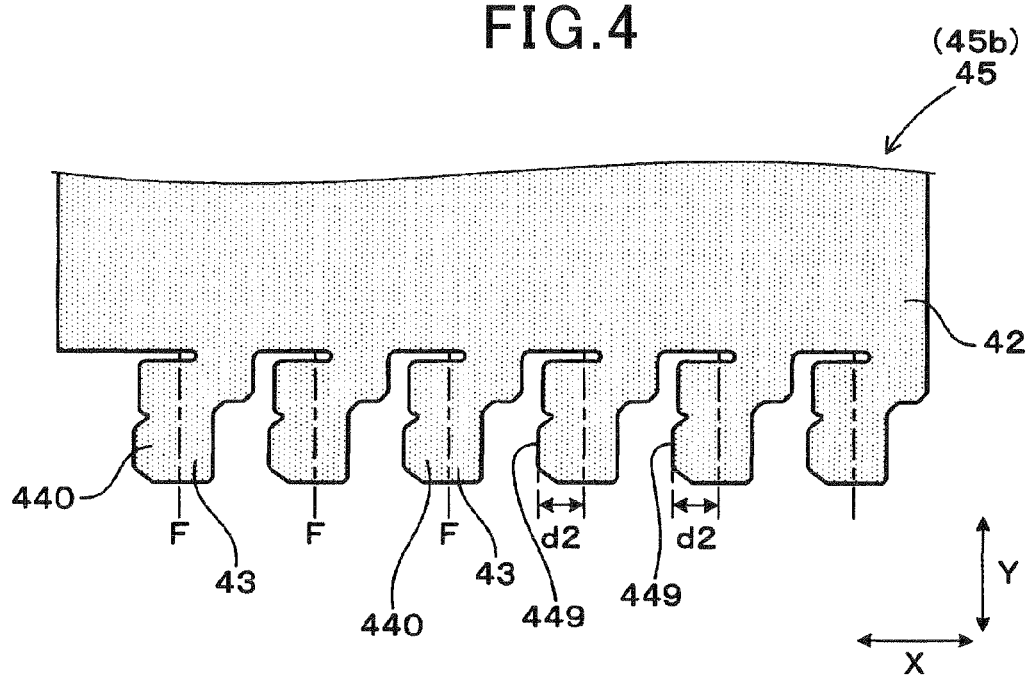
FIG. 4 shows a plan view of another plate member that forms the positive bus bar before bending in the first embodiment.
Figure 8:
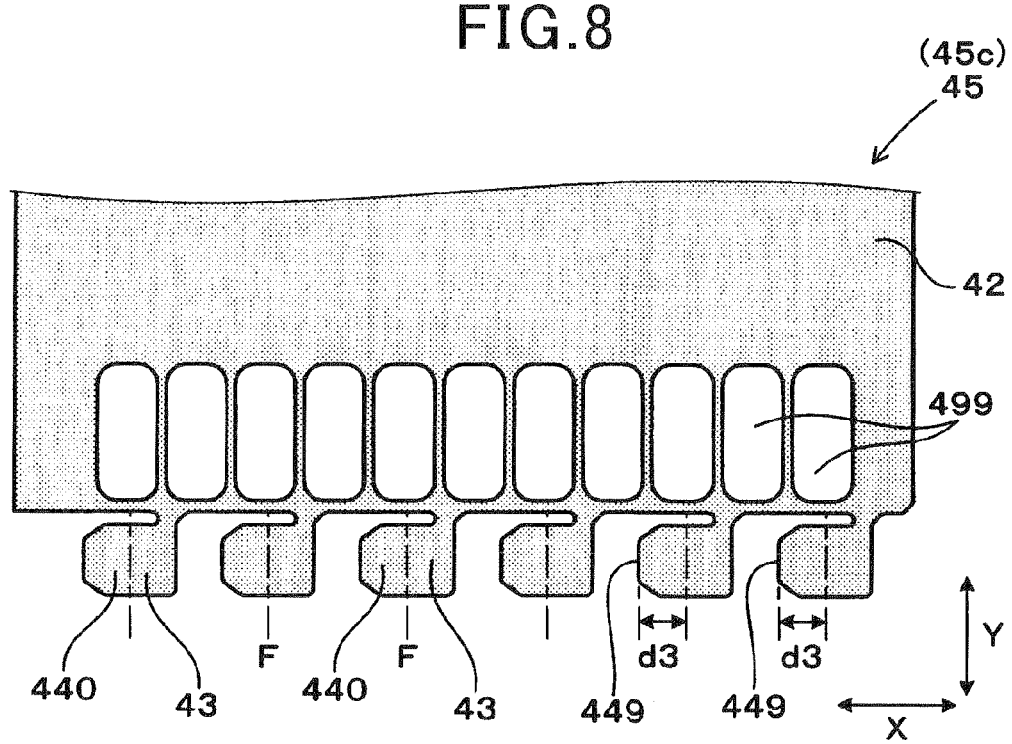
FIG. 8 shows a plan view of one plate member that forms a negative bus bar before bending in the first embodiment.
Figure 10:
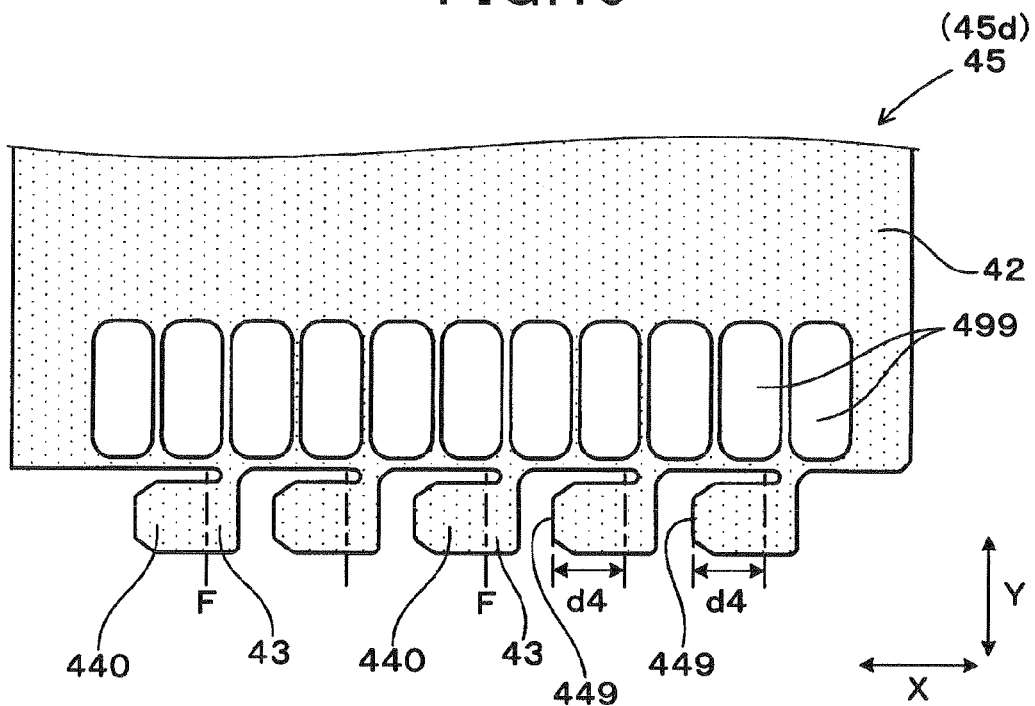
FIG. 10 shows a plan view of another plate member that forms the negative bus bar before bending in the first embodiment.

The other plate members 41a, 40b, and 41b are manufactured in the same manner (refer to FIGS. 4, 8, and 10).

Figure 5:
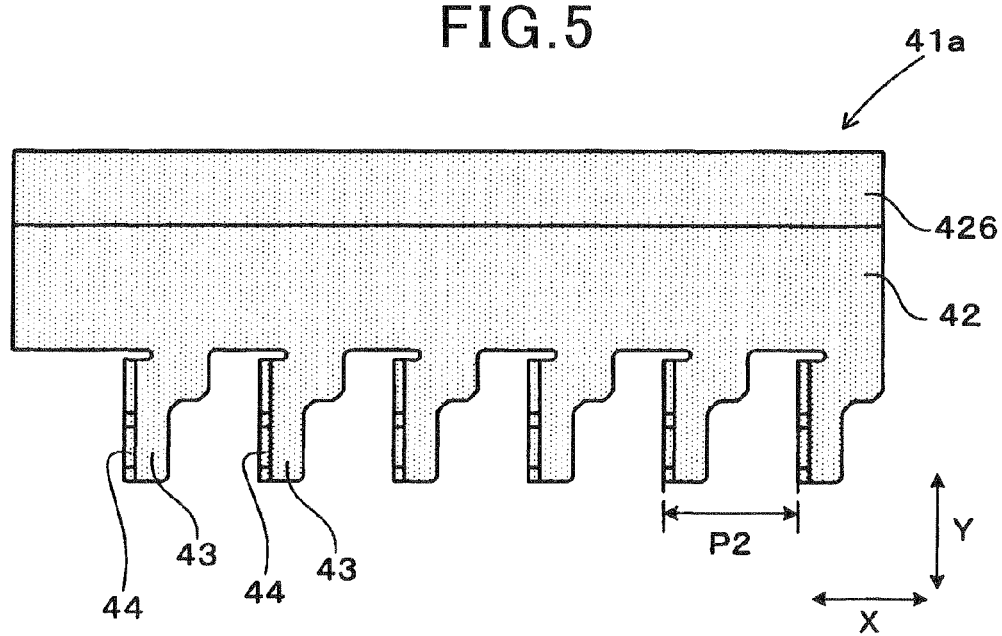
FIG. 5 shows a plan view of the plate member shown in FIG. 4 after bending.

As shown in FIGS. 3 and 5, among the two sheets of the plate members 40a and 41a that constitute the positive bus bar 4a, a pitch P1 between the adjoining extended portions 43 of the first plate member 40a and a pitch P2 between the adjoining extended portions 43 of the second plate member 41a are equal to each other.

Further, as shown in FIGS. 2 and 4, a length d2 of the portion 440 in the X direction in the second not-bent member 45b is longer than a length d1 of the portion 440 in the X direction in the first not-bent member 45a by a thickness of the body portion 42.

This ensures that when forming the positive bus bar 4a by joining the first and second plate members 40a and 41a, heights of end surfaces 449 in the Z direction of all the terminal connecting portions 44 become equal (refer to FIG. 7).

Further, as shown in FIG. 6, when the two plate members 40a and 41a are joined, gaps S are formed between the terminal connecting portions 44 of the first plate member 40a and the extended portions 43 of the second plate member 41a.

Further, the gaps S are formed between the extended portions 43 of the first plate member 40a and the terminal connection portions 44 of the second plate member 41a as well.

When connecting the positive terminal 22 to the terminal connecting portion 44 (refer to FIG. 1), the positive terminal 22 passes through the gap S.

Further, as shown in FIG. 6, the pitch P of the joined plate members 40a and 41a is a half of the pitches P1, P2 (refer to FIG. 3, FIG. 5) of each plate member 40a, 41a.

As shown in FIGS. 7 and 16, portions 425 and 426 on the opposite side in the Y direction where the extended portions 43 of the first and second plate members 40a and 41a are formed are bent to form a stepped shape, and these portions 425, 426 serve as capacitor connecting portions for being connected to the positive electrode 33 of the capacitor 3.

On the other hand, as shown in FIGS. 8 to 11, the first plate member 40b and the second plate member 41b that constitute the negative bus bar 4b have the body portions 42 with the same shape to each other.

A plurality of through-holes 499 is formed to the body portions 42.

These through holes 499 are provided in order to pass through the positive terminals 22 (refer to FIG. 1).

Figure 9:
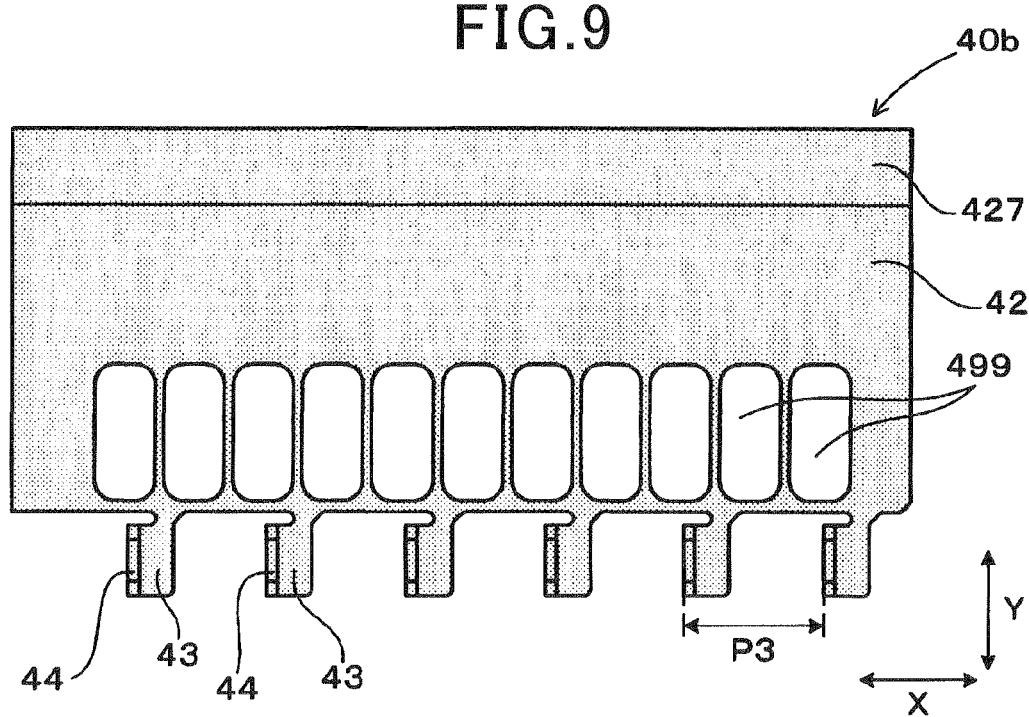
FIG. 9 shows a plan view of the plate member shown in FIG. 8 after bending.
Figure 11:
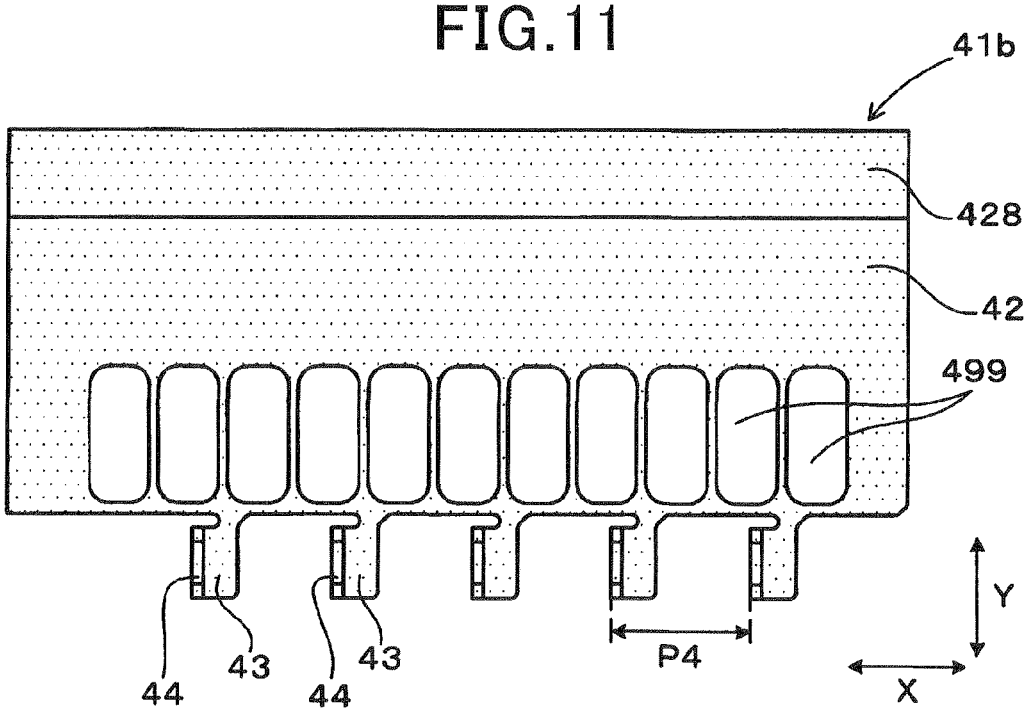
FIG. 11 shows a plan view of the plate member shown in FIG. 10 after bending.

As shown in FIGS. 9 and 11, a pitch P3 between the adjoining extended portions 43 of the first plate member 40b and a pitch P4 between the adjoining extended portions 43 of the second plate member 41b are equal to each other.

Further, as shown in FIGS. 8 and 10, a length d4 of the portion 440 in the X direction in the second not-bent member 45d is longer than a length d3 of the portion 440 in the X direction in the first not-bent member 45c by the thickness of the body portion 42.

This ensures that when forming the negative bus bar 4b by joining the first and second plate members 40b and 41b, heights of end surfaces 449 in the Z direction of all the terminal connecting portions 44 become equal (refer to FIG. 13).

As shown in FIGS. 12 and 13, when the two plate members 40b and 41b are joined, gaps S are formed between the terminal connecting portions 44 of the first plate member 40b and the extended portions 43 of the second plate member 41b.

Further, the gaps S are formed between the extended portions 43 of the first plate member 40b and the terminal connection portions 44 of the second plate member 41b as well.

When connecting the negative terminal 23 to the terminal connecting portion 44 (refer to FIG. 1), the negative terminal 23 passes through the gap S.

As shown in FIGS. 13 and 16, portions 427 and 428 on the opposite side in the Y direction where the extended portions 43 of the first and second plate members 40b and 41b are formed are bent to form a stepped shape, and these portions 427, 428 serve as capacitor connecting portions for being connected to the negative electrode 34 of the capacitor 3.

Meanwhile, as shown in FIG. 1, the electric power converter 1 of the present embodiment includes a frame 16 made of metal. The stacked body 10 is fixed into the frame 16.

Figure 14:
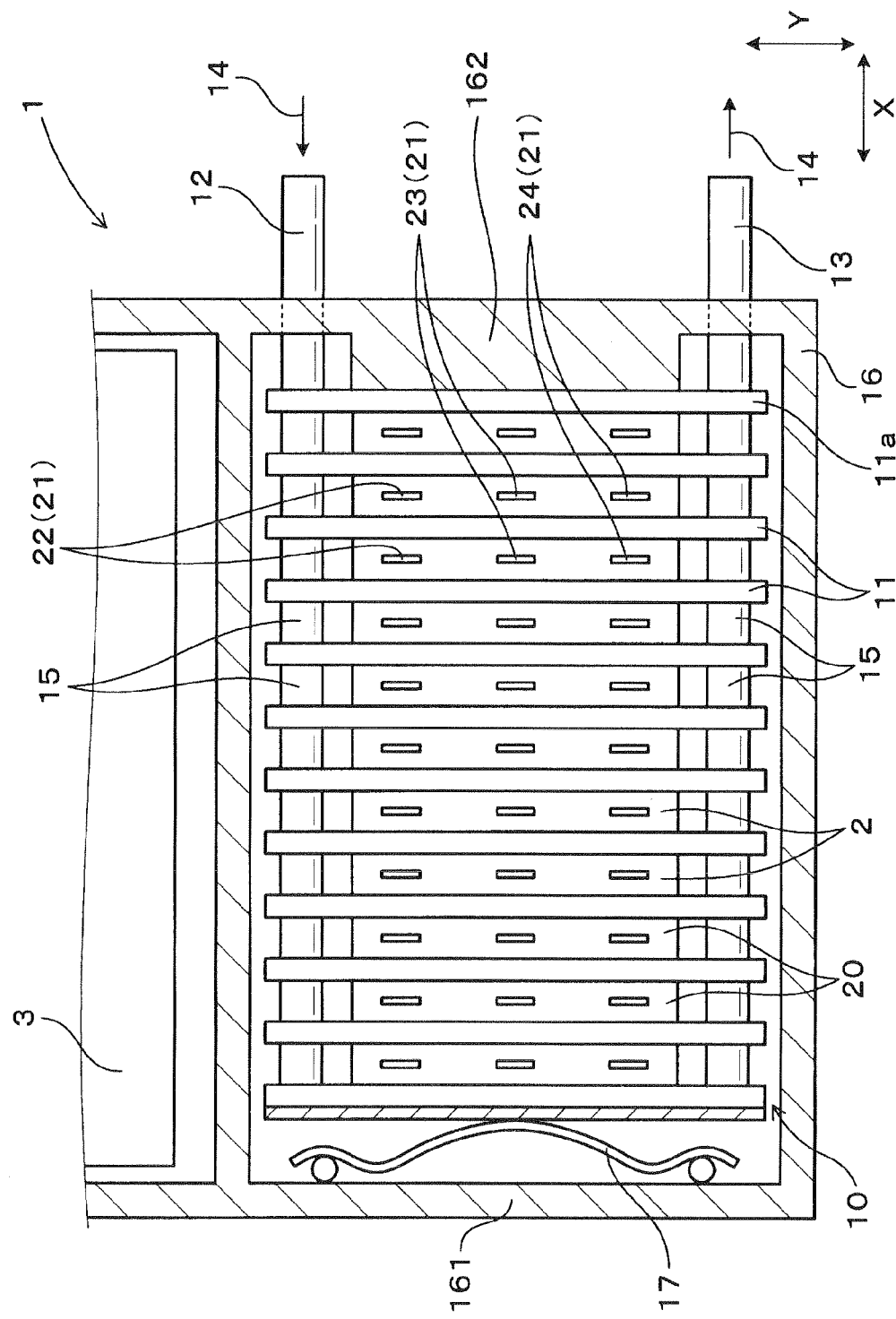
FIG. 14 shows a plan view of the electric power converter shown in FIG. 1 without the negative bus bar and the positive bus bar.

As shown in FIG. 14, two coolers 11 adjoining in the X direction are connected by connecting pipes 15 in end portions thereof in the Y direction.

Further, an inlet pipe 12 for introducing a refrigerant 14 and an outlet pipe 13 for discharging the refrigerant 14 are connected to a cooler 11a positioned at one end in the X direction among the plurality of the coolers 11.

When the refrigerant 14 is introduced from the introduction pipe 12, the refrigerant 14 flows through all the coolers 11 via the connecting tubes 15, and discharged from the outlet pipe 13. Thereby, the semiconductor modules 2 are cooled.

Further, among two wall portions 161 and 162 of the frame 16 orthogonal to the X direction, an elastic member 17 (e.g. leaf spring) is interposed between one of the wall portions 161 and the stacked body 10.

The stacked body 10 is pressed against another one of the wall portions 162 (a wall portion on a side provided with the outlet pipe 13 and the inlet pipe 12) by the elastic member 17.

Thus, while ensuring the contact pressure between the semiconductor modules 2 and the coolers 11, the stacked body 10 is fixed into the frame 16.

Although the elastic member 17 is interposed between the one of the wall portions 161 and the stacked body 10 in the present embodiment, the elastic member 17 may be disposed between the other one of the wall portions 162 and the stacked body 10.

Figure 15:
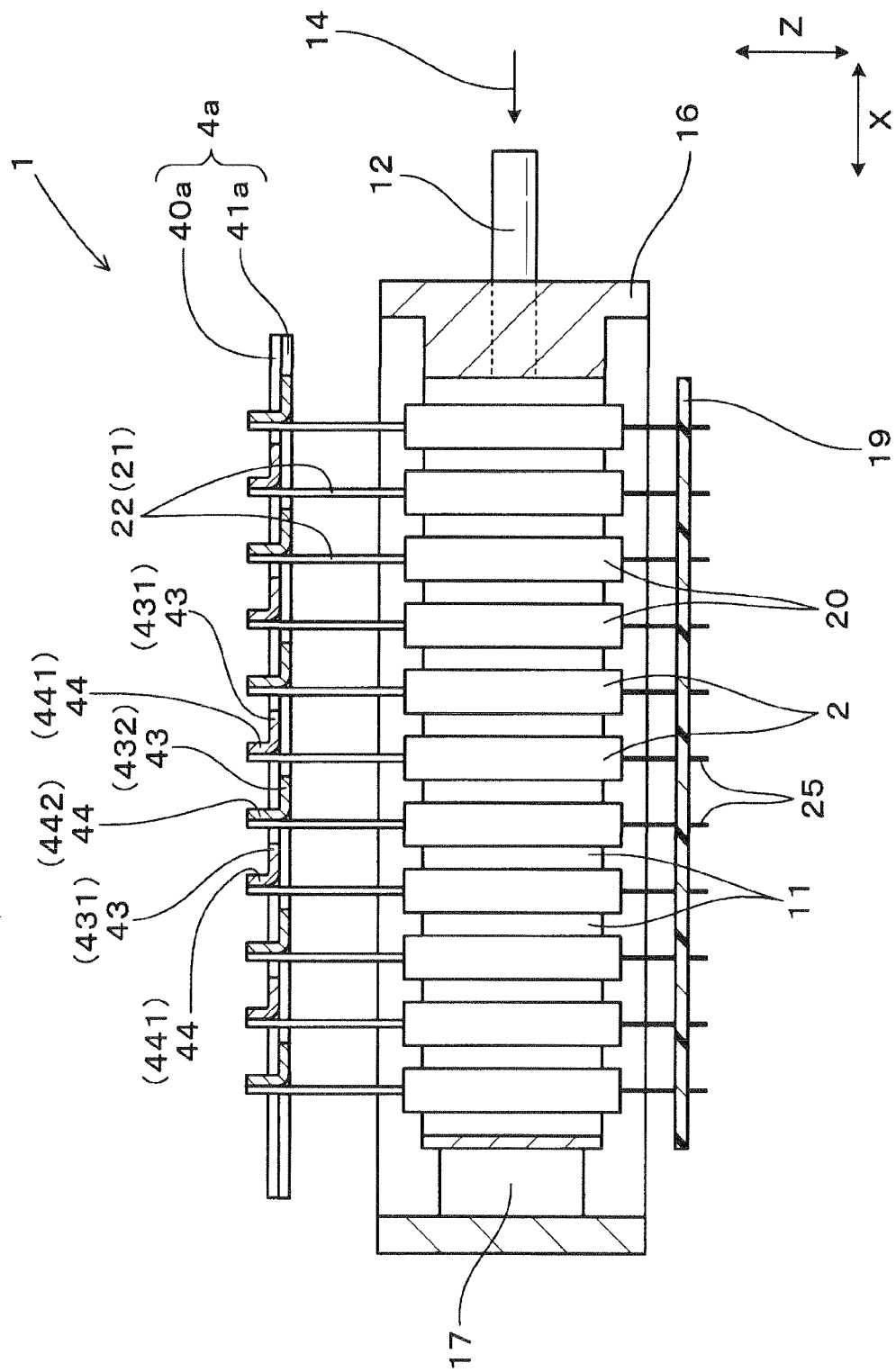
FIG. 15 shows a cross-sectional view taken along a line XV-XV of the electric power converter shown in FIG. 1 without the negative bus bar.

As shown in FIGS. 15 and 16, a plurality of control terminals 25 is projecting from the main body portions 20 of the semiconductor modules 2.

These control terminals 25 are connected to a control circuit board 19.

By turning on and off the semiconductor elements 29 (refer to FIG. 17) by the control circuit board 19, the DC voltage applied between the positive terminals 22 and the negative terminals 23 is converted into the AC voltage, and is outputted from the AC terminals 24.

As shown in FIG. 16, the capacitor 3 is disposed at a position adjacent to the stacked body 10 in the Y direction.

The capacitor 3 has a capacitor element 30 and a resin member 300.

A part of the capacitor element 30 is accommodated in a capacitor housing portion 160 that is integral with the frame 16, and is sealed with the resin member 300. The capacitor element 30 is a film capacitor.

One of ends in the Z direction of the capacitor element 30 serves as a positive electrode 33, while another one of the ends serves as a negative electrode 34.

Capacitor connecting portions 425,426 of the positive bus bar 4a are connected to the positive electrode 33, and capacitor connecting portions 427,428 of the negative bus bar 4b are connected to the negative electrode 34.

Further, as shown in FIG. 16, there exists a proximal plate member 41a that is disposed at a position close to the sealed portion 20 of the semiconductor module 2 in the Z direction, and there exists a distal plate member 40a that is disposed at a position farther from the sealed portion 20 in the Z direction than the proximal plate member 41a in the first and second plate members 40a and 41a that constitute the positive bus bar 4a.

Similarly, there exists a proximal plate member 41b and a distal plate member 40b in the first and second plate members 40b and 41b that constitute the negative bus bar 4b.

Further, as shown in FIG. 1, a set of terminal pair 49 is formed by the positive terminal 22 and the negative terminal 23 that are disposed adjacent to each other in the Y direction.

The positive terminal 22 and the negative terminal 23 that constitute a single terminal pair 49 projects from a single sealed portion 20.

In the terminal pairs 49, some of the pairs take a first connection state A, while other pairs take a second connection state B.

In the first connection state A, the positive terminal 22 is connected to a terminal connecting portion 442 of the proximal plate member 41a of the positive bus bar 4a, and the negative terminal 23 is connected to a terminal connection portion 443 of the distal plate member 40b of the negative bus bar 4b.

In addition, in the second connection state B, the positive terminal 22 is connected to a terminal connecting portion 441 of the distal plate member 40a of the positive bus bar 4a, and the negative terminal 23 is connected to the terminal connecting portion 444 of the proximal plate member 41b of the negative bus bar 4b.

Then, the terminal pair 49 that takes the first connection state A and the terminal pair 49 that takes the second connection state B are disposed alternately in the X direction.

Next, functions and effects of the present embodiment are explained.

As shown in FIGS. 1, 7, and 13, the plurality of sheets of the plate members 40, 41 is used to form the single bus bar 4 in the present embodiment.

Each of the plate members 40, 41 has the body portion 42a, the extended portions 43, and the terminal connecting portions 44.

Then, the main body portion 42 of each plate member 40, 41 are joined to each to other form the single bus bar 4 so that the terminal connecting portions 44 formed in the same plate member 40 (41) do not adjoin to each other in the X direction.

Thus, even if the pitch between the terminal connecting portions 44 is narrow when the bus bar 4 is formed by joining the plurality of the plate members 40 and 41, it is possible to obtain a wider pitch between the terminal connecting portions 44 for the individual plate member 40, 41.

Therefore, it becomes possible to increase the length of the extended portion 43 in the X direction.

Thereby, it is possible to prevent the extended portions 43 from being elongated, and can suppress an increase of a parasitic inductance in the extended portions 43.

As shown in FIG. 2 to FIG. 5 and FIG. 8 to FIG. 11, in order to manufacture the individual plate member 40, 41, the above-mentioned not-bent member 45 is made as an intermediate step.

In the present embodiment, since it is possible to widen the pitches P1 to P4 of the terminal connecting portions 44 of the plate members 40 and 41, it is also possible to widen the pitches of the portions 440 to be the terminal connecting portions 44 of the not-bent member 45.

Thereby, it is possible to widen the interval in the X direction between the portion 440 to be the terminal connecting portion 44 and the adjoining extended portion 43.

Therefore, while ensuring sufficient length of the portion 440 in the X direction, the length of the extended portions 43 in the X direction can be sufficiently lengthened.

Thereby, it is possible to prevent the extended portions 43 from being elongated, and can suppress an increase of a parasitic inductance in the extended portions 43.

Further, in the present embodiment, the terminal pair 49 that takes the first connection state A and the terminal pair 49 that takes the second connection state B are disposed alternately in the X direction as shown in FIG. 1.

In this way, it is possible to equalize the parasitic inductances in the positive terminals 22 and the negative terminals 23 of all the terminal pairs 49.

That is, since the length from the sealed portion 20 to the distal plate member 40 is long in the power terminal 21 (the positive terminal 22 or the negative terminal 23) of the semiconductor module 2 connected to the distal plate member 40, the parasitic inductance is likely to increase.

Further, since the length from the sealed portion 20 to the proximal plate member 41 is short in the power terminal 21 to be connected to the proximal plate member 41, the parasitic inductance is likely to be small.

Thus, suppose both the two power terminals 21 that constitute the terminal pair 49 are connected to the distal plate member 40, the parasitic inductances of both the power terminals 21 increase.

In addition, suppose both the two power terminals 21 are connected to the proximal plate member 41, the parasitic inductances of both the power terminals 21 reduce.

When the terminal pair with a large parasitic inductance and the terminal pair with a small parasitic inductance exist, a designer may be necessary to design the electronic circuit concerning this, so that the burden on the designer increases.

In the present embodiment, terminal pair 49 is configured to take either one of the first connection state A or the second connection state B.

Under such a connection condition, one of the power terminals 21 (the positive terminal 22 or the negative terminal 23) among the two is connected to the proximal plate member 41, and the other one of the power terminals 21 is connected to the distal plate member 40.

Therefore, it is possible to equalize the parasitic inductances in the power terminals 21 of all the terminal pairs 49. Thus, it becomes easy for the designer to design the circuit.

As shown in FIG. 17 in the present embodiment, the AC terminals 24 of the two adjoining semiconductor modules 2 are connected in parallel, and are connected to the input terminals 89a of the first AC load 81a.

Thus, when connecting the two adjoining AC terminals of the semiconductor modules 2 in parallel, it is particularly preferred that the parasitic inductances of the power terminals 21 (the positive terminals 22 and negative terminals 23) are equalized.

As described above, according to the present embodiment, it is possible to provide an electric power converter capable of increasing the length of the extended portions in the stacking direction, and capable of suppressing the increase of the parasitic inductance in the extended portions.

Although the semiconductor module 2 with two sets of the semiconductor elements 29 (refer to FIG. 17) sealed in the sealed portion 20 is used in the present embodiment, the semiconductor module 2 with a single set of the semiconductor element 29 sealed in the sealed portion 20 may be used.

In such a case, two semiconductor modules 2 are arranged in the Y direction, and the terminal pair 49 is constituted by the positive terminal 22 of one of the semiconductor modules 2 and the negative terminal 23 of the other one of the semiconductor modules 2.

Further, although the single bus bar 4 is formed by using two plate members 40 and 41 in the present embodiment, three or more plate members may be used to form the bus bar 4.

Further, the cooler 11 of the electric power converter of the present disclosure in the present embodiment is not limited to form a refrigerant passage (the cooling pipe) inside the cooler 11 and to bring the cooler 11 into contact with the semiconductor module 2.

That is, for example, it is also possible to form the refrigerant passage so that the coolant 14 contacts directly with the semiconductor module 2.

It should be appreciated that, in the following embodiments, components identical with or similar to those in the first embodiment are given the same reference numerals, and structures and features thereof will not be described in order to avoid redundant explanation.

[Second Embodiment]

The present embodiment is an example that a shape of the bus bar 4 and a connection state of the terminal pair 49 are changed.

Figure 18:
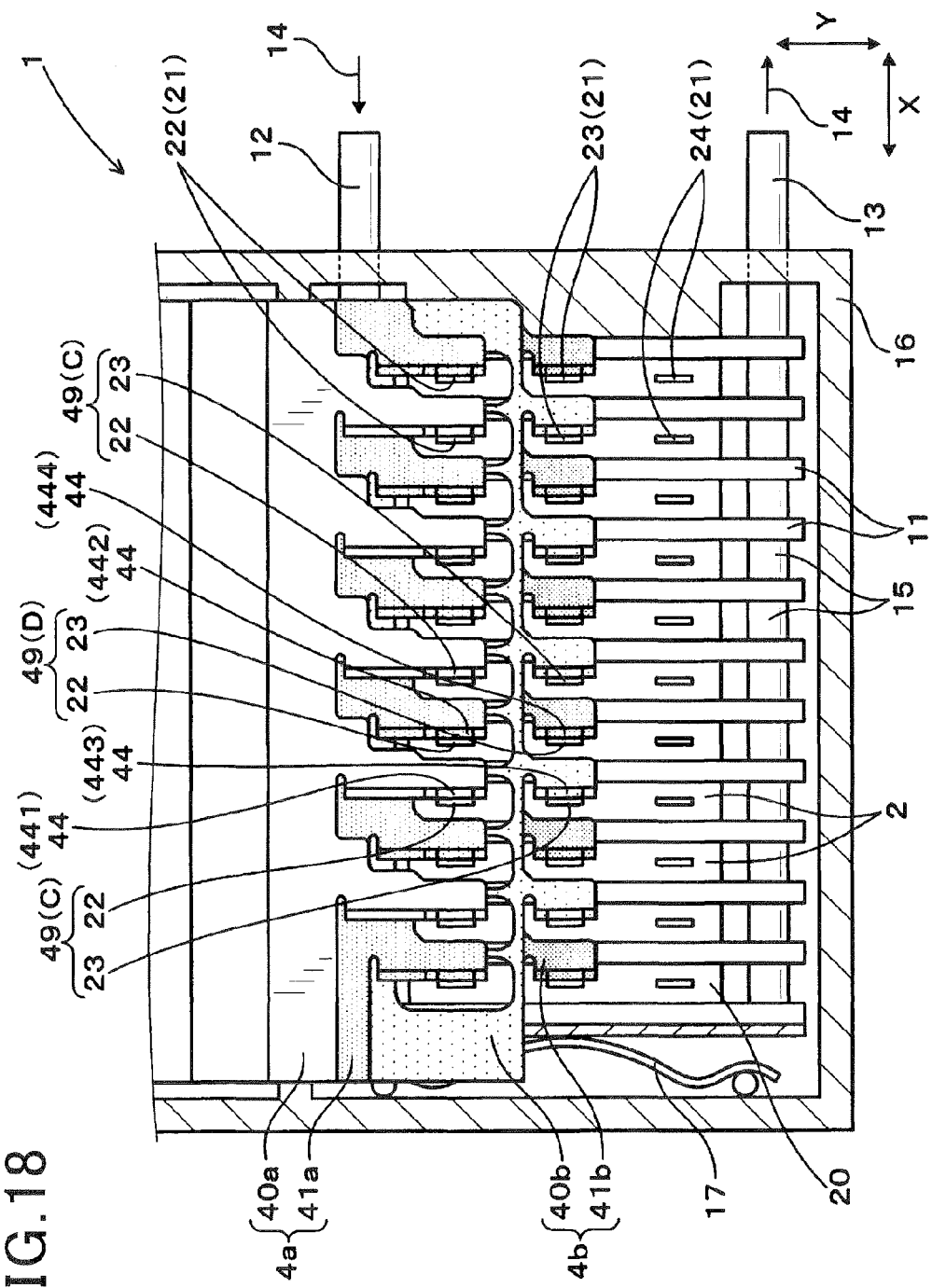
FIG. 18 shows a plan view of the electric power converter in a second embodiment.

As shown in FIG. 18, in the present embodiment, the terminal pair 49 is to take either one of a third connection state C or a fourth connection state D.

In the third connection state C, positive terminal 22 is connected to the terminal connecting portion 441 of the distal plate member 40a positive of the bus bar 4a, and the negative terminal 23 is connected to the terminal connection portion 443 of the distal plate member 40b of the negative bus bar 4b.

In addition, in the fourth connection state D, the positive terminal 22 is connected to the terminal connecting portion 442 of the proximal plate member 41a of the positive bus bar 4a, and the negative terminal 23 is connected to the terminal connecting portion 444 of the proximal plate member 41b of the negative bus bar 4b.

Figure 19:
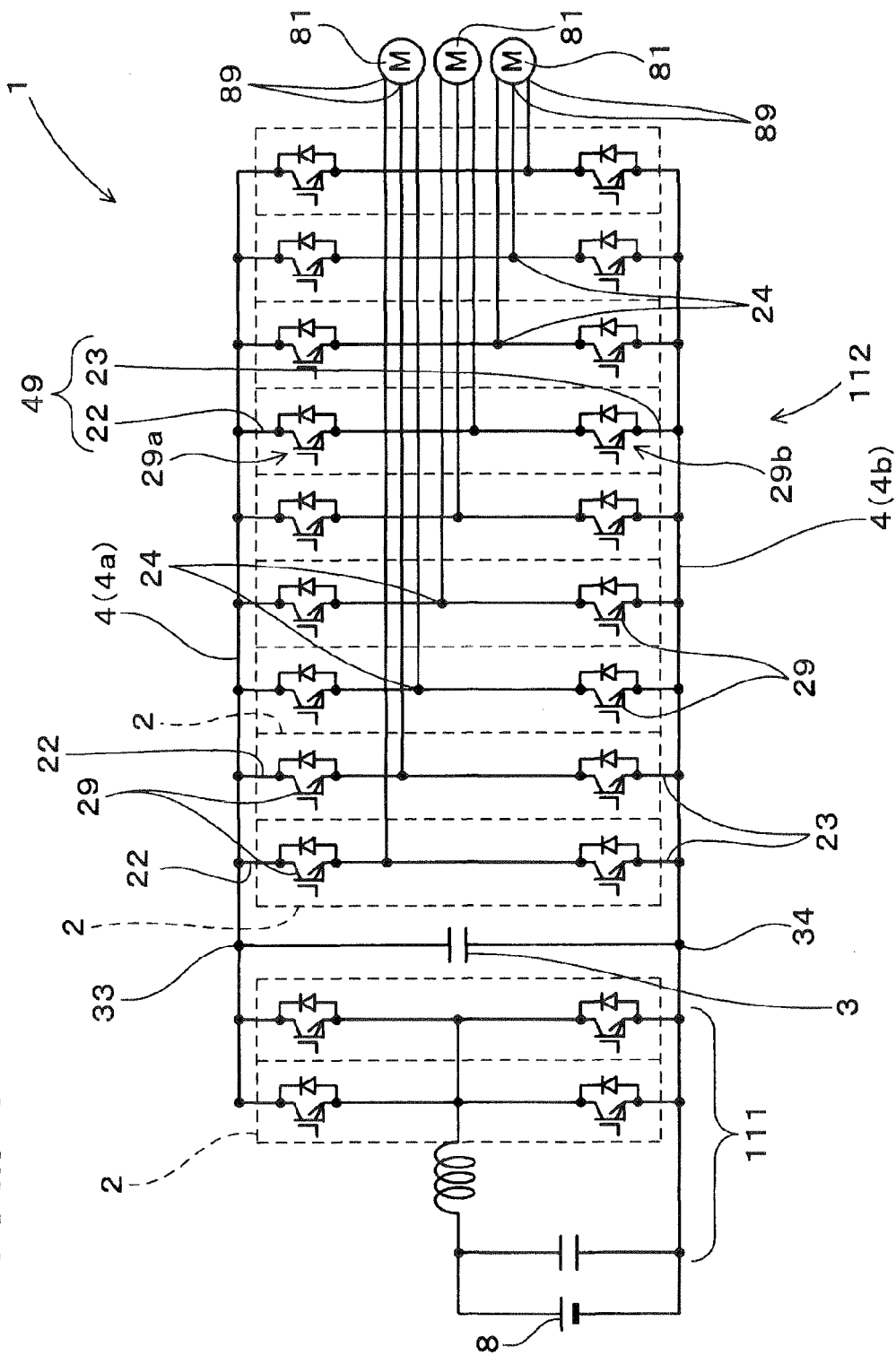
FIG. 19 shows a circuit diagram of the electric power converter in the second embodiment.

As shown in FIG. 19, the electric power converter 1 of the present embodiment is configured to drive three AC loads 81.

The input terminal 89 of each AC load 81 is connected to the AC terminal 24 of the respective semiconductor module 2.

That is, in the present embodiment, unlike the first embodiment, the AC terminals 24 of the two adjoining semiconductor modules 2 are not connected in parallel.

Thus, when the two adjoining AC terminals 24 of the semiconductor modules 2 are not connected in parallel, it does not greatly affect the circuit operation in many cases even if the parasitic inductances in the power terminals 21 (the positive terminal 22 and the negative terminal 23) are not uniform between the two adjoining semiconductor modules 2.

Therefore, in this case, it is possible to configure the terminal pairs 49 to take the third connection state C and the fourth connection state D alternately.

This ensures that the terminal pairs 49 do not have to to take the first connection state A and the second connection state B (refer to FIG. 1), thus flexibility in the design is increased, and facilitating the design of the electrical circuit possible.

Others are the same as in the first embodiment.

[Third Embodiment]

The present embodiment is an example that the configuration of the capacitor 3 is changed.

Figure 20:
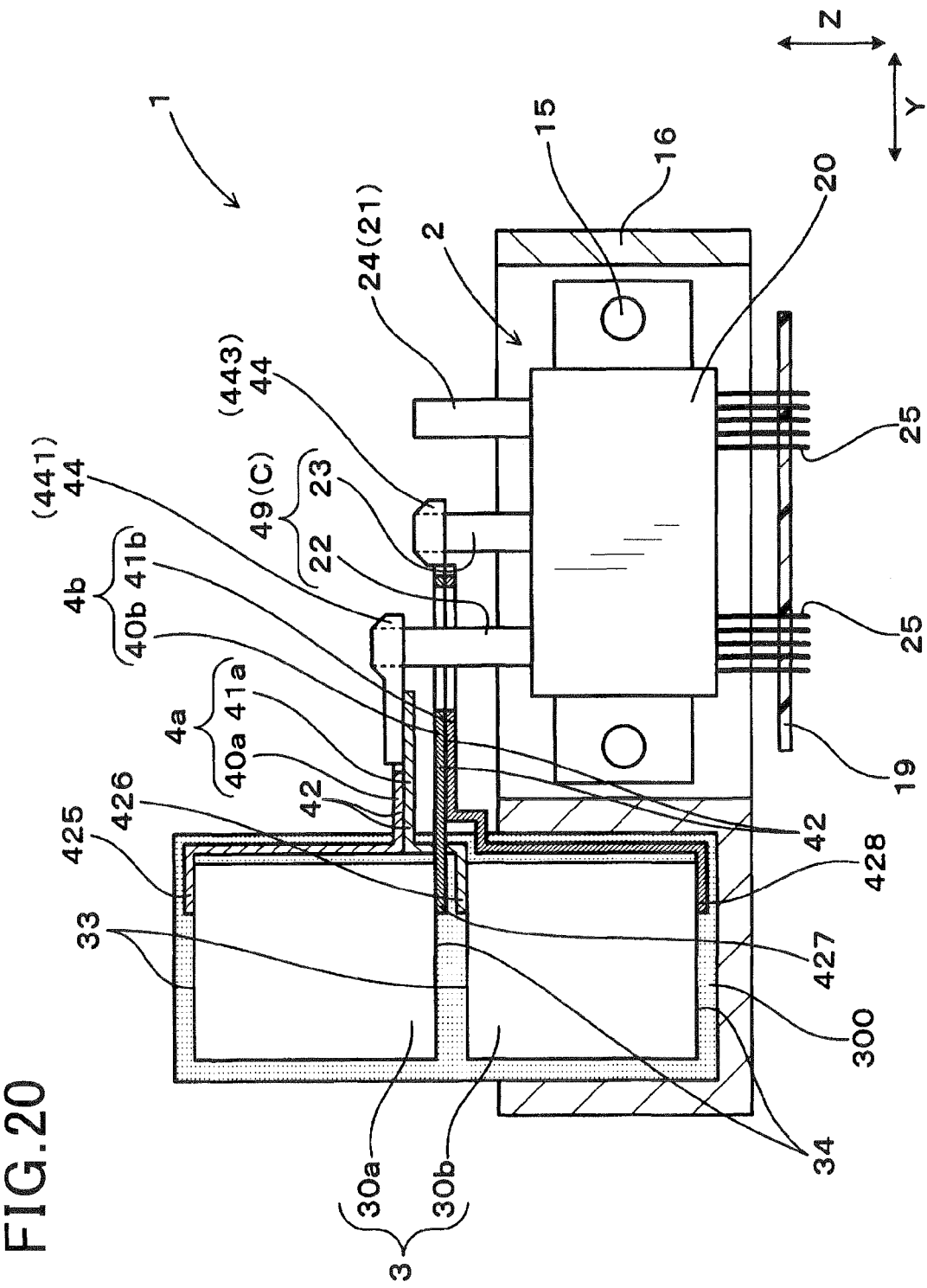
FIG. 20 shows a cross-sectional view of the electric power converter in which a semiconductor module takes a third connection state in a third embodiment.
Figure 21:
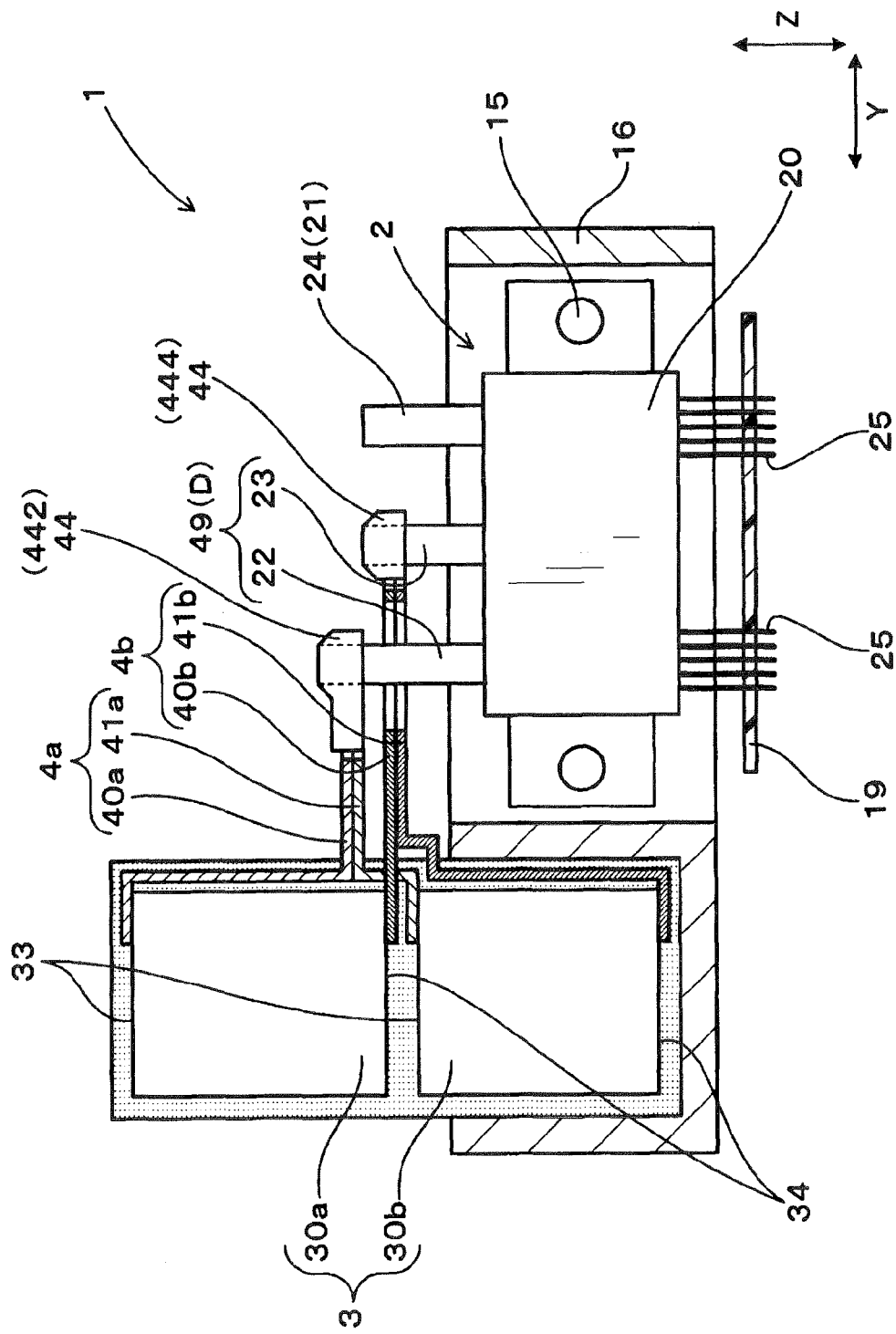
FIG. 21 shows a cross-sectional view of the electric power converter in which the semiconductor module takes a fourth connection state in the third embodiment.

As shown in FIGS. 20 and 21, the capacitor 3 of the present embodiment has a plurality of capacitor elements 30 (30a, 30b) that are connected in parallel to each other.

Then, each of the plate members 40, 41 that constitutes the bus bar 4 is connected to the different capacitor elements 30a, 30b, respectively.

The capacitor element 30 includes a proximate capacitor element 30b disposed at a position close to the sealed portion 20 in the Z direction, and a distant capacitor element 30a disposed farther from the sealed portion 20 in the Z direction than the proximate capacitor element 30b is.

The distal plate member 40a of the positive bus bar 4a is connected to the positive electrode 33 of the distant capacitor element 30a, and the proximal plate member 41a is connected to the positive electrode 33 of the proximate capacitor element 30b.

Further, the distal plate member 40b of the negative bus bar 4b is connected to the negative electrode 34 of the distant capacitor element 30a, and the proximal plate member 41b is connected to the negative electrode 34 of the proximate capacitor element 30b.

In the present embodiment, end surfaces of the capacitor elements 30a, 30b far from the control circuit board 19 in the Z direction become the positive electrodes 33, and end surfaces closer to the control circuit board 19 in the Z direction become the negative electrode 34.

Further, in the present embodiment, the terminal pair 49 that takes the third connection state C (refer to FIG. 20) and the terminal pair 49 that takes the fourth connection terminal D (refer to FIG. 21) are disposed alternately in the X direction.

Next, functions and effects of the present embodiment are explained.

With the above configuration, it is possible to reduce the parasitic inductance of the capacitor 3 as a whole.

That is, each of the capacitor elements 30a, 30b that forms the capacitor 3 has the parasitic inductance.

The larger the number of the capacitor element 30, it is easier to reduce the parasitic inductance of the all.

For example, when n capacitor elements are connected in parallel by the plate members mentioned above, and assuming that the parasitic inductance in the each capacitor element is L, the entire parasitic inductance becomes L/n.

As described above, when configured to use the bus bar 4 made of the plurality of plate members 40 and 41, and each of the plate members 40, 41 is connected to the capacitor element 30 separately, it is possible to connect more capacitor elements 30.

Therefore, it is possible to further reduce the parasitic inductance of the entire capacitor 3 that further reduces the surge voltage.

Further, since two pieces of the capacitor elements 30, i.e., the distant capacitor element 30a and the proximate capacitor element 30b are stacked in two stages in the Z direction in the present embodiment, capacitor element 30a each, it is possible to shorten the distance from each capacitor element 30a, 30b to the semiconductor modules 2 in the Y direction.

Therefore, it is possible to shorten the length in the Y direction of the bus bars 4a, 4b.

In addition, although the capacitor 3 of the present embodiment is provided with the single distant capacitor element 30a and the single proximate capacitor element 30b, respective capacitor elements 30a, 30b may be divided, and the plurality of the distant capacitor elements 30a and the capacitor element 30b proximate may be arranged in the X direction.

Further, although the terminal pair 49 is to take either one of the third connection state C (refer to FIG. 20) or the fourth connection state D (refer to FIG. 21) in the present embodiment, either one of the first connection state A or the second connection state (refer to FIG. 1) may be taken.

Others are the same as in the first embodiment.

[Fourth Embodiment]

The present embodiment is an example that the positions of the electrodes of the capacitor element 30a, 30b are changed.

Figure 22:
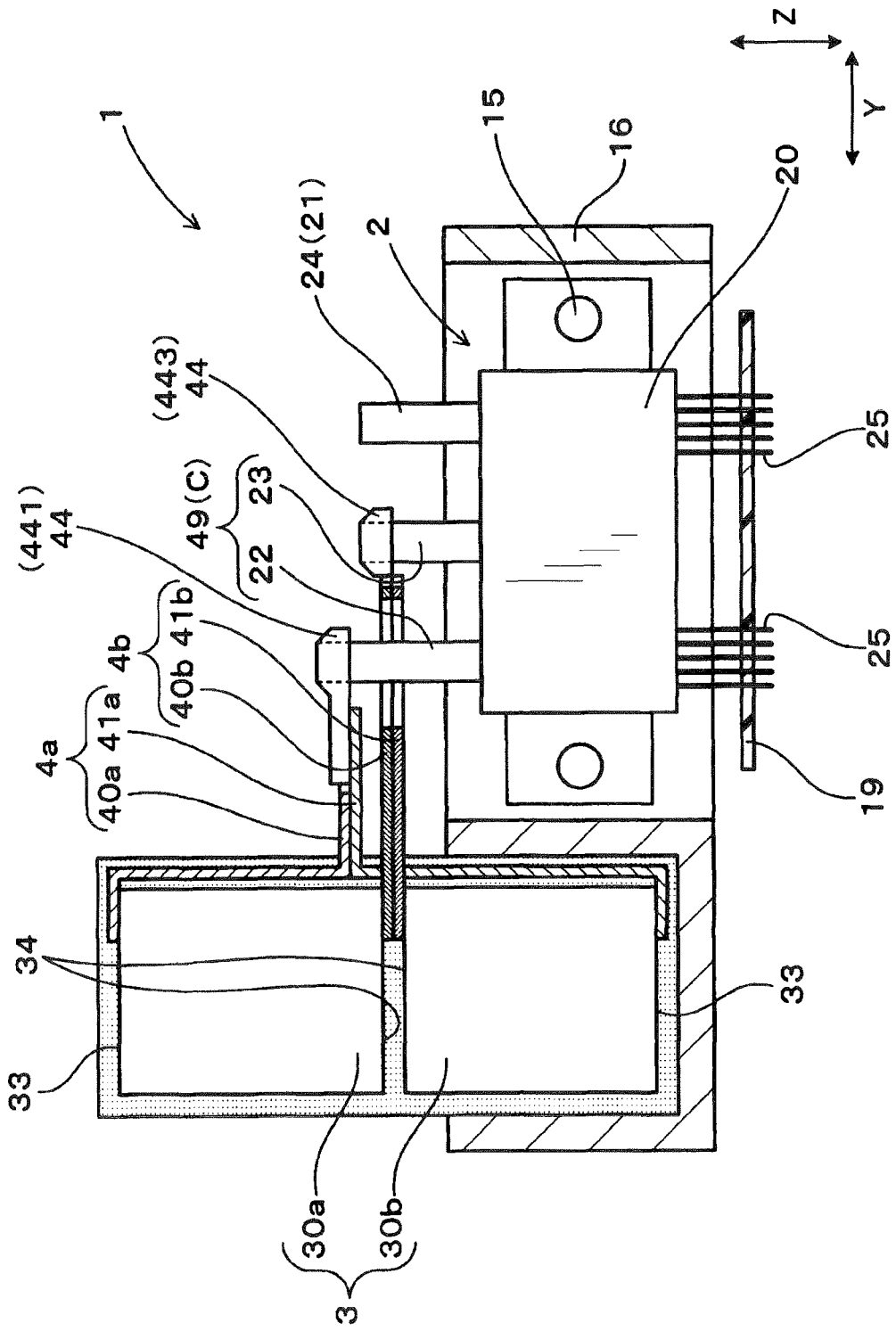
FIG. 22 shows a cross-sectional view of the electric power converter in which the semiconductor module takes a third connection state in a fourth embodiment.
Figure 23:
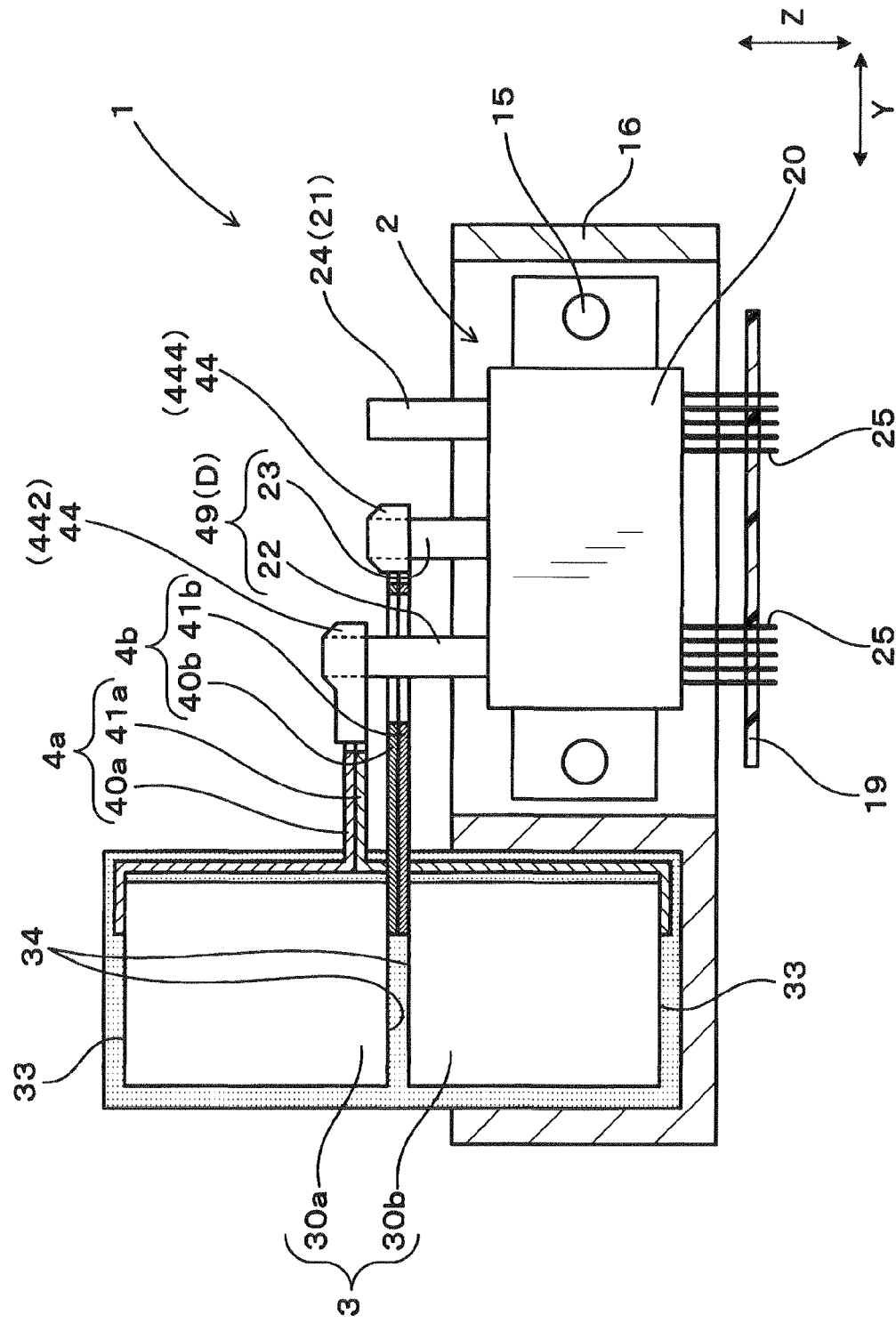
FIG. 23 shows a cross-sectional view of the electric power converter in which the semiconductor module takes a fourth connection state in the fourth embodiment.

In the present embodiment, as shown in FIGS. 22 and 23, an end surface of the proximate capacitor element 30b closer to the control circuit board 19 in the Z direction and an end surface of the distant capacitor element 30a far from the control circuit board 19 in the Z direction are configured to be the positive electrodes 33.

Further, an end surface on the proximate capacitor element 30b far from the control circuit board 19 in the Z direction and an end surface on the distant capacitor element 30a close to the control circuit board 19 in the Z direction are configured to be the negative electrodes 34.

The distal plate member 40a of the positive bus bar 4a is connected to the positive electrode 33 of the distant capacitor element 30a.

Further, the proximal plate member 41a of the positive bus bar 4a is connected to the positive electrode 33 of the proximate capacitor element 30b.

Furthermore, the distal plate member 40b of the negative bus bar 4b is connected to the negative electrode 34 of the distant capacitor element 30a.

Moreover, the proximal plate member 41b of the negative bus bar 4b is connected to the negative electrode 34 of the proximate capacitor element 30b.

In the present embodiment, the terminal pairs 49 that take the third connection state C (refer to FIG. 22) and the terminal pairs 49 that take the fourth connection state D (refer to FIG. 23) are disposed alternately in the X direction.

Others are the same as in the third embodiment.

What is claimed is:

1. An electric power converter comprising:
   a stacked body formed by stacking a plurality of semiconductor modules having power terminals projecting from a sealed portion where a semiconductor element is sealed and coolers that cool the semiconductor modules;
   a capacitor for smoothing a DC voltage; and
   a bus bar that electrically connects the power terminals and the capacitor, wherein:
   the bus bar of the same potential is made of a plurality of plate members that are electrically connected to each other;
   each of the plate members is provided with a body portion disposed so that a main surface thereof is perpendicular with respect to a projecting direction of the power terminals;
   a plurality of extended portions is extending from the main body portion in an extending direction perpendicular to both a stacking direction of the stacked body and the projecting direction;
   terminal connecting portions are erected in the projecting direction from each of the extended portions;
   a main surface of the terminal connecting portion is perpendicular with respect to the stacking direction;
   the terminal connecting portions are joined to the power terminals and are connected to each other;
   the main body portion of each plate member are joined to each other to form the bus bar so that the terminal connecting portions formed in the same plate member do not adjoin to each other in the stacking direction;
   the bus bar is formed by combining the plurality of plate members while the extended portions extend toward the same direction;
   the capacitor has a plurality of capacitor elements that are connected in parallel to each other;
   each of the plate members that constitutes the bus bar is connected to a respective one of the capacitor elements;
   the plurality of capacitor elements includes a proximate capacitor element disposed at a position close to the sealed portion in the projecting direction and a distant capacitor element disposed farther from the sealed portion in the projecting direction than the proximate capacitor element
   the bus bar includes (i) a positive bus bar constituted by a proximal plate member disposed at a position close to the sealed portion in the projecting direction and a distal plate member disposed at a position farther from the sealed portion than the proximal plate member of the positive bus bar, and (ii) a negative bus bar constituted by a proximal plate member disposed at a position close to the sealed portion in the projecting direction and a distal plate member disposed at a position farther from the sealed portion than the proximal plate member of the negative bus bar;
   the distal plate member of the positive bus bar is connected to a positive electrode of the distant capacitor element, and the proximal plate member of the positive bus bar is connected to a positive electrode of the proximate capacitor element; and
   the distal plate member of the negative bus bar is connected to a negative electrode of the distant capacitor element, and the proximal plate member of the negative bus bar is connected to the negative electrode of the proximate capacitor element.

2. The electric power converter according to claim 1, wherein:
   the power terminals are composed of a positive terminal and a negative terminal where the DC voltage is applied;
   the positive bus bar and the negative bus bar are constituted of two plate members that include a proximal plate member disposed at a position close to the sealed portion in the projecting direction and a distal plate member disposed at a position farther from the sealed portion than the proximal plate member;
   a set of terminal pairs is formed by the positive terminal and the negative terminal disposed adjacent to each other in the extending direction;
   in the terminal pairs, there is a terminal pair that takes a first connection state where the positive terminal is connected to the proximal plate member of the positive bus bar and the negative terminal is connected to the distal plate member of the negative bus bar and another terminal pair that takes a second connection state where the positive terminal is connected to the distal plate member of the positive bus bar and the negative terminal is connected to the proximal plate member of the negative bus bar; and
   the terminal pair that takes the first connection state and the other terminal pair that takes the second connection state are disposed alternately in the stacking direction.

* * * * *